(12) United States Patent
Ikeda

(10) Patent No.: US 10,079,231 B2
(45) Date of Patent: Sep. 18, 2018

(54) SEMICONDUCTOR DEVICE

(71) Applicant: Semiconductor Energy Laboratory Co., Ltd., Kanagawa-ken (JP)

(72) Inventor: Takayuki Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/291,276

(22) Filed: Oct. 12, 2016

(65) Prior Publication Data

US 2017/0110453 A1    Apr. 20, 2017

(30) Foreign Application Priority Data

Oct. 15, 2015    (JP) .................................. 2015-203976

(51) Int. Cl.
| | | |
|---|---|---|
| *H03K 19/08* | (2006.01) | |
| *H01L 27/088* | (2006.01) | |
| *H01L 23/535* | (2006.01) | |
| *H01L 27/115* | (2017.01) | |
| *H01L 29/24* | (2006.01) | |

(52) U.S. Cl.
CPC .......... *H01L 27/088* (2013.01); *H01L 23/535* (2013.01); *H01L 27/115* (2013.01); *H01L 29/24* (2013.01)

(58) Field of Classification Search
CPC ........... H03K 19/0008; H03K 19/0013; H03K 19/08; H03K 19/094; H03K 19/0944; H03K 19/0948
USPC ........... 326/21, 26–27, 82–83, 112, 119, 121
See application file for complete search history.

(56) References Cited

U.S. PATENT DOCUMENTS

| | | | | |
|---|---|---|---|---|
| 4,533,841 A | * | 8/1985 | Konishi | ........... H03K 19/09425 326/38 |
| 6,989,706 B2 | * | 1/2006 | Sekigawa | ........ H03K 3/356017 327/434 |
| 7,898,297 B2 | * | 3/2011 | Kapoor | ........... H01L 21/823807 326/93 |
| 8,161,427 B2 | | 4/2012 | Morgenshtein et al. | |

(Continued)

FOREIGN PATENT DOCUMENTS

| | | |
|---|---|---|
| JP | 09-093118 A | 4/1997 |
| JP | 09-307006 A | 11/1997 |

(Continued)

*Primary Examiner* — Jason M Crawford
(74) *Attorney, Agent, or Firm* — Husch Blackwell LLP

(57) ABSTRACT

A semiconductor device with a small number of transistors is provided. The semiconductor device includes a first transistor, a second transistor, a third transistor, a first wiring, and a second wiring. The first transistor includes a first gate and a second gate. The first gate and the second gate overlap with each other with a semiconductor therebetween. The first wiring and the second wiring are supplied with a high power supply potential and a low power supply potential, respectively. A first terminal of the first transistor is electrically connected to the first gate and the first wiring. A second terminal of the first transistor is electrically connected to the second gate. The second terminal of the first transistor is electrically connected to the second wiring through the second transistor and the third transistor. The first transistor, the second transistor, and the third transistor are preferably n-channel transistors.

15 Claims, 24 Drawing Sheets

(56) References Cited

U.S. PATENT DOCUMENTS

| | | | |
|---|---|---|---|
| 8,207,756 B2* | 6/2012 | Shionoiri | H01L 27/1225 326/104 |
| 8,305,109 B2* | 11/2012 | Okazaki | H01L 27/1214 257/205 |
| 8,744,038 B2* | 6/2014 | Hirose | G11C 19/28 377/64 |
| 2002/0070409 A1* | 6/2002 | Yonemaru | H03K 19/0013 257/365 |
| 2007/0013413 A1* | 1/2007 | Chiang | H03K 19/0948 326/121 |
| 2007/0262793 A1* | 11/2007 | Kapoor | H01L 29/8086 326/101 |
| 2010/0231263 A1 | 9/2010 | Fish et al. | |
| 2012/0062313 A1* | 3/2012 | Le Coz | G05F 3/205 327/543 |

FOREIGN PATENT DOCUMENTS

| | | |
|---|---|---|
| JP | 2007-096055 A | 4/2007 |
| JP | 2007-123861 A | 5/2007 |

* cited by examiner

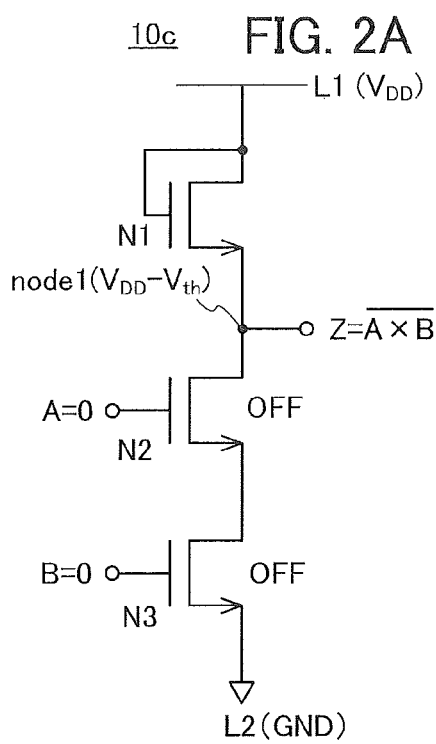
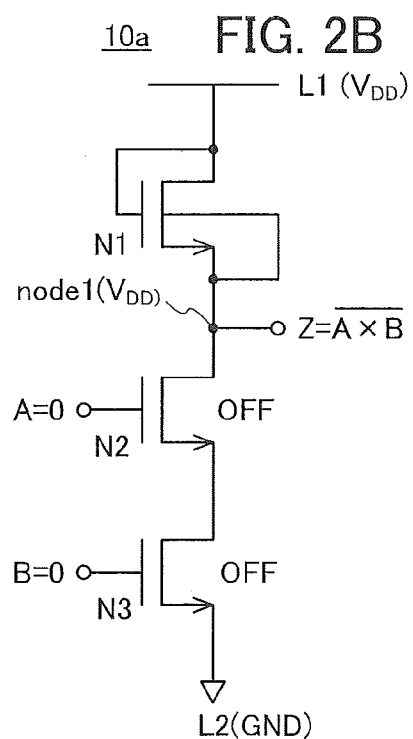

$Z = \overline{A1 \times A2 \times \cdots \times Am}$ $Z = \overline{A1 + A2 + \cdots + A(2n)}$ $Z = \overline{A1 + A2 + \cdots + Am}$ $Z = \overline{A1 \times A2 \times \cdots \times A(2n)}$ 100a 100a 100b FIG. 10A
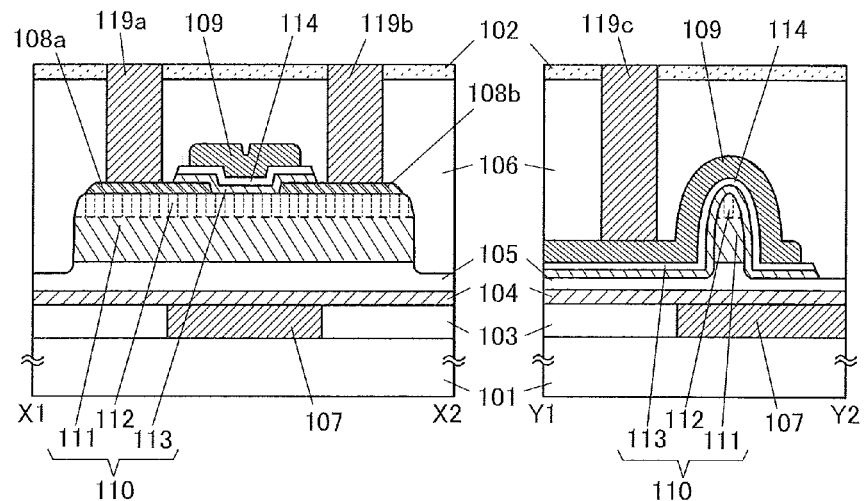
100c FIG. 10B
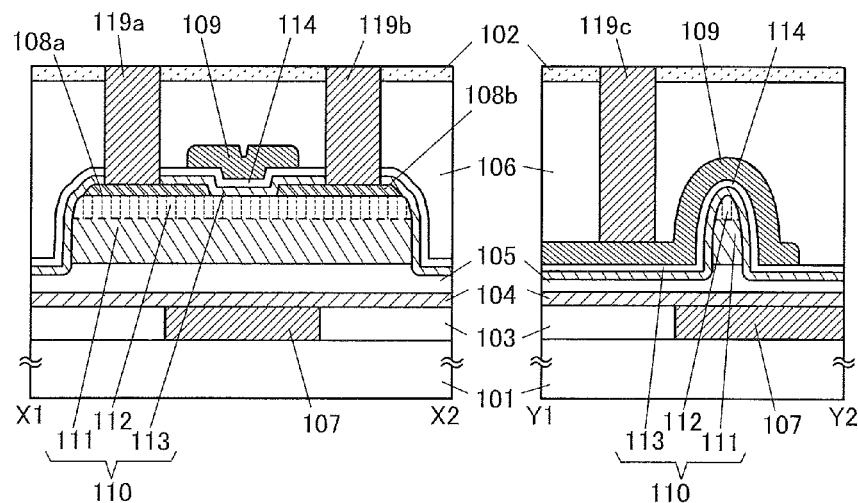

680

680

750 PLD

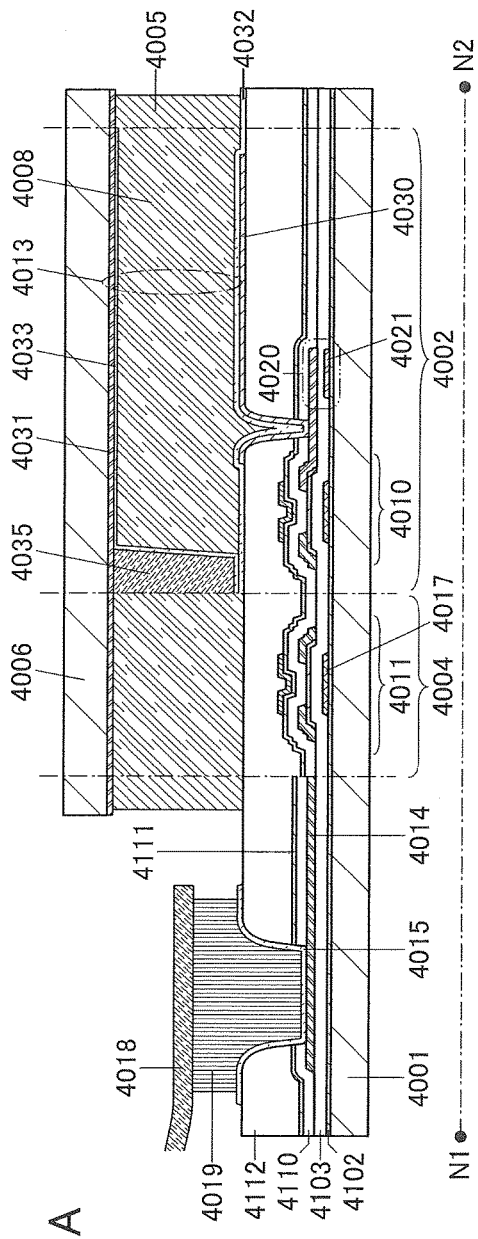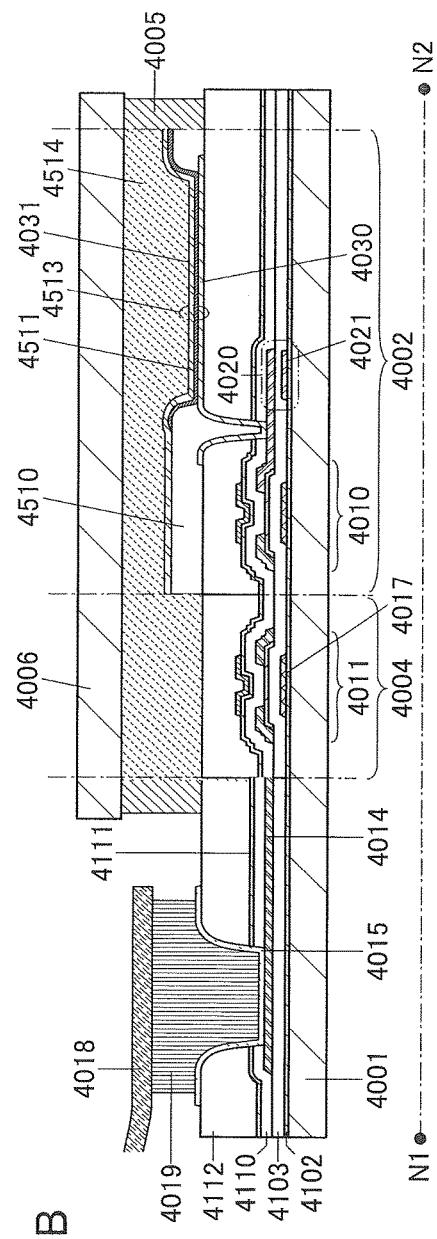
FIG. 23A
FIG. 23B

SEMICONDUCTOR DEVICE

BACKGROUND OF THE INVENTION

1. Field of the Invention

One embodiment of the present invention relates to a semiconductor device.

The present invention relates to an object, a method, or a manufacturing method. In addition, the present invention relates to a process, a machine, manufacture, or a composition of matter.

In this specification and the like, a semiconductor device generally means a device that can function by utilizing semiconductor characteristics. In some cases, a memory device, a display device, a light-emitting device, an electro-optical device, a semiconductor circuit, or an electronic device includes a semiconductor device.

2. Description of the Related Art

A complementary metal oxide semiconductor (CMOS) logic circuit used for a large-scale integrated (LSI) circuit has a problem in that the number of transistors is large. In contrast, in the case of a pass transistor logic circuit, a complicated logic can be formed with a small number of transistors (Patent Document 1). As an example of a pass transistor logic circuit, a cascode voltage switch logic (CVSL) circuit can be given (FIG. 3A). In a pass transistor logic circuit, the number of wirings is small and wiring capacitance is small. Therefore, the capacitance of charge and discharge relating to switching is small, so that power consumption can be low.

A technique by which a transistor is formed using a semiconductor thin film formed over a substrate having an insulating surface has been attracting attention. The transistor is used in a wide range of electronic devices such as an integrated circuit (IC) or a display device. A silicon-based semiconductor is widely known as a semiconductor material that can be applied to the transistor, but an oxide semiconductor (OS) has been attracting attention as an alternative material. For example, a technique for manufacturing a transistor using zinc oxide or an In—Ga—Zn-based oxide semiconductor as an oxide semiconductor is disclosed (see Patent Documents 2 and 3).

REFERENCES

Patent Documents

[Patent Document 1] Japanese Published Patent Application No. H9-93118
[Patent Document 2] Japanese Published Patent Application No. 2007-123861
[Patent Document 3] Japanese Published Patent Application No. 2007-96055

SUMMARY OF THE INVENTION

Although the number of transistors used in a pass transistor logic circuit is smaller than that in a CMOS logic circuit, it is still large because inverted signals are generally needed in a pass transistor logic circuit.

An object of one embodiment of the present invention is to provide a semiconductor device with a small number of transistors. Another object of one embodiment of the present invention is to provide a semiconductor device with a small area. Another object of one embodiment of the present invention is to provide a semiconductor device with low power consumption. Another object of one embodiment of the present invention is to provide a novel semiconductor device.

Note that the descriptions of a plurality of objects do not preclude the existence of each object. One embodiment of the present invention does not necessarily achieve all the objects listed above. Objects other than those listed above are apparent from the description of the specification, drawings, claims, and the like, and such objects could be an object of one embodiment of the present invention.

One embodiment of the present invention is a semiconductor device including a first transistor, a second transistor, a third transistor, a first wiring, and a second wiring. The first transistor includes a first gate and a second gate. The first gate and the second gate overlap with each other with a semiconductor therebetween. The first wiring is configured to transmit a high power supply potential. The second wiring is configured to transmit a low power supply potential. A first terminal of the first transistor is electrically connected to the first gate. The first terminal of the first transistor is electrically connected to the first wiring. A second terminal of the first transistor is electrically connected to the second gate. The second terminal of the first transistor is electrically connected to the second wiring through the second transistor and the third transistor. The first transistor, the second transistor, and the third transistor are preferably n-channel transistors.

In the above embodiment, a gate of the second transistor is configured to receive data A. A gate of the third transistor is configured to receive data B. The second terminal of the first transistor is configured to output data Z. The data A, the data B, and the data Z are each of a Boolean data type. The data Z is denoted by NOT(A×B).

In the above embodiment, the semiconductor preferably includes an oxide semiconductor.

Another embodiment of the present invention is a semiconductor device including a first transistor, a second transistor, a first wiring, and a second wiring. The first transistor includes a first gate and a second gate. The first gate and the second gate overlap with each other with a first semiconductor therebetween. The second transistor includes a third gate and a fourth gate. The third gate and the fourth gate overlap with each other with a second semiconductor therebetween. The first wiring is configured to transmit a high power supply potential. The second wiring is configured to transmit a low power supply potential. A first terminal of the first transistor is electrically connected to the first gate. The first terminal of the first transistor is electrically connected to the first wiring. A second terminal of the first transistor is electrically connected to the second gate. The second terminal of the first transistor is electrically connected to the second wiring through the second transistor. The first transistor and the second transistor are preferably n-channel transistors.

In the above embodiment, the third gate is configured to receive data A. The fourth gate is configured to receive data B. The second terminal of the first transistor is configured to output data Z. The data A, the data B, and the data Z are each of a Boolean data type. The data Z is denoted by NOT(A+B).

In the above embodiment, the first semiconductor and the second semiconductor each preferably include an oxide semiconductor.

Another embodiment of the present invention is a semiconductor device including a first transistor, a second transistor, a third transistor, a first wiring, and a second wiring. The first transistor includes a first gate and a second gate. The first gate and the second gate overlap with each other with a semiconductor therebetween. The first wiring is configured to transmit a high power supply potential. The second wiring is configured to transmit a low power supply potential. A first terminal of the first transistor is electrically connected to the first gate. The first terminal of the first transistor is electrically connected to the second wiring. A second terminal of the first transistor is electrically connected to the second gate. The second terminal of the first transistor is electrically connected to the first wiring through the second transistor and the third transistor. The first transistor, the second transistor, and the third transistor are preferably p-channel transistors.

In the above embodiment, a gate of the second transistor is configured to receive data A. A gate of the third transistor is configured to receive data B. The second terminal of the first transistor is configured to output data Z. The data A, the data B, and the data Z are each of a Boolean data type. The data Z is denoted by NOT(A+B).

Another embodiment of the present invention is a semiconductor device including a first transistor, a second transistor, a first wiring, and a second wiring. The first transistor includes a first gate and a second gate. The first gate and the second gate overlap with each other with a first semiconductor therebetween. The second transistor includes a third gate and a fourth gate. The third gate and the fourth gate overlap with each other with a second semiconductor therebetween. The first wiring is configured to transmit a high power supply potential. The second wiring is configured to transmit a low power supply potential. A first terminal of the first transistor is electrically connected to the first gate. The first terminal of the first transistor is electrically connected to the second wiring. A second terminal of the first transistor is electrically connected to the second gate. The second terminal of the first transistor is electrically connected to the first wiring through the second transistor. The first transistor and the second transistor are preferably p-channel transistors.

In the above embodiment, the third gate is configured to receive data A. The fourth gate is configured to receive data B. The second terminal of the first transistor is configured to output data Z. The data A, the data B, and the data Z are each of a Boolean data type. The data Z is denoted by NOT(A×B).

Another embodiment of the present invention is a semiconductor device including a first transistor, a second transistor, a third transistor, a first wiring, and a second wiring. The first transistor includes a first gate and a second gate. The first gate and the second gate overlap with each other with a first semiconductor therebetween. The second transistor includes a third gate and a fourth gate. The third gate and the fourth gate overlap with each other with a second semiconductor therebetween. The third transistor includes a fifth gate and a sixth gate. The fifth gate and the sixth gate overlap with each other with a third semiconductor therebetween. The first wiring is configured to transmit a high power supply potential. The second wiring is configured to transmit a low power supply potential. A first terminal of the first transistor is electrically connected to the first gate. The first terminal of the first transistor is electrically connected to the first wiring. A second terminal of the first transistor is electrically connected to the second gate. The second terminal of the first transistor is electrically connected to the second wiring through the second transistor and the third transistor. The first transistor, the second transistor, and the third transistor are preferably n-channel transistors.

In the above embodiment, the third gate is configured to receive data A. The fourth gate is configured to receive data C. The fifth gate is configured to receive data B. The sixth gate is configured to receive the data C. The second terminal of the first transistor is configured to output data Z. The data A, the data B, the data C, and the data Z are each of a Boolean data type. The data Z is denoted by NOT((A×B)+C).

In the above embodiment, the first semiconductor, the second semiconductor, and the third semiconductor each preferably include an oxide semiconductor.

Another embodiment of the present invention is a semiconductor device including a first transistor, a second transistor, a third transistor, a first wiring, and a second wiring. The first transistor includes a first gate and a second gate. The first gate and the second gate overlap with each other with a first semiconductor therebetween. The second transistor includes a third gate and a fourth gate. The third gate and the fourth gate overlap with each other with a second semiconductor therebetween. The first wiring is configured to transmit a high power supply potential. The second wiring is configured to transmit a low power supply potential. A first terminal of the first transistor is electrically connected to the first gate. The first terminal of the first transistor is electrically connected to the first wiring. A second terminal of the first transistor is electrically connected to the second gate. The second terminal of the first transistor is electrically connected to the second wiring through the second transistor and the third transistor. The first transistor, the second transistor, and the third transistor are preferably n-channel transistors.

In the above embodiment, the third gate is configured to receive data A. The fourth gate is configured to receive data B. A gate of the third transistor is configured to receive data C. The second terminal of the first transistor is configured to output data Z. The data A, the data B, the data C, and the data Z are each of a Boolean data type. The data Z is denoted by NOT((A+B)×C).

In the above embodiment, the first semiconductor and the second semiconductor each preferably include an oxide semiconductor.

Another embodiment of the present invention is a semiconductor device including a first transistor, a second transistor, a third transistor, a first wiring, and a second wiring. The first transistor includes a first gate and a second gate. The first gate and the second gate overlap with each other with a first semiconductor therebetween. The second transistor includes a third gate and a fourth gate. The third gate and the fourth gate overlap with each other with a second semiconductor therebetween. The third transistor includes a fifth gate and a sixth gate. The fifth gate and the sixth gate overlap with each other with a third semiconductor therebetween. The first wiring is configured to transmit a high power supply potential. The second wiring is configured to transmit a low power supply potential. A first terminal of the first transistor is electrically connected to the first gate. The first terminal of the first transistor is electrically connected to the second wiring. A second terminal of the first transistor is electrically connected to the second gate. The second terminal of the first transistor is electrically connected to the first wiring through the second transistor and the third transistor. The first transistor, the second transistor, and the third transistor are preferably p-channel transistors.

In the above embodiment, the third gate is configured to receive data A. The fourth gate is configured to receive data C. The fifth gate is configured to receive data B. The sixth gate is configured to receive the data C. The second terminal of the first transistor is configured to output data Z. The data A, the data B, the data C, and the data Z are each of a Boolean data type. The data Z is denoted by NOT((A+B)× C).

Another embodiment of the present invention is a semiconductor device including a first transistor, a second transistor, a third transistor, a first wiring, and a second wiring. The first transistor includes a first gate and a second gate. The first gate and the second gate overlap with each other with a first semiconductor therebetween. The second transistor includes a third gate and a fourth gate. The third gate and the fourth gate overlap with each other with a second semiconductor therebetween. The first wiring is configured to transmit a high power supply potential. The second wiring is configured to transmit a low power supply potential. A first terminal of the first transistor is electrically connected to the first gate. The first terminal of the first transistor is electrically connected to the first wiring. A second terminal of the first transistor is electrically connected to the second gate. The second terminal of the first transistor is electrically connected to the second wiring through the second transistor and the third transistor. The first transistor, the second transistor, and the third transistor are preferably p-channel transistors.

In the above embodiment, the third gate is configured to receive data A. The fourth gate is configured to receive data B. A gate of the third transistor is configured to receive data C. The second terminal of the first transistor is configured to output data Z. The data A, the data B, the data C, and the data Z are each of a Boolean data type. The data Z is denoted by NOT((A×B)+C).

Another embodiment of the present invention is an electronic device including the semiconductor device of the above embodiment and at least one of a microphone, a speaker, a display portion, and an operation button.

According to one embodiment of the present invention, a semiconductor device with a small number of transistors can be provided. According to one embodiment of the present invention, a semiconductor device with a small area can be provided. According to one embodiment of the present invention, a semiconductor device with low power consumption can be provided. According to one embodiment of the present invention, a novel semiconductor device can be provided.

Note that the description of these effects does not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

FIGS. 2A and 2B are circuit diagrams each illustrating an operation of a semiconductor device.

FIGS. 10A and 10B are cross-sectional views each illustrating one embodiment of a transistor.

FIGS. 23A and 23B are cross-sectional views each illustrating an example of a display device.

DETAILED DESCRIPTION OF THE INVENTION

Figure 1A:
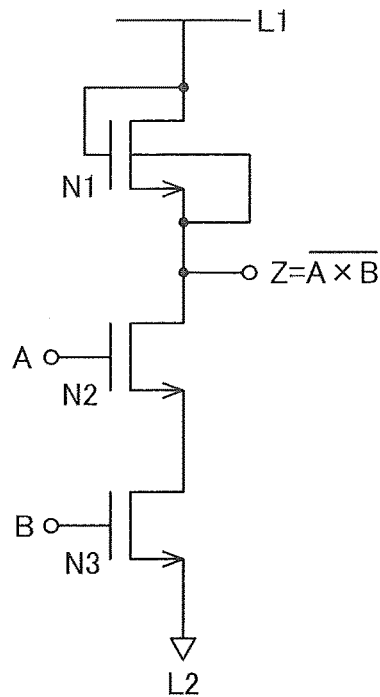
FIGS. 1A to 1D are circuit diagrams each illustrating one embodiment of a semiconductor device.

Embodiments will be described below with reference to drawings. The embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

Furthermore, in the present specification, any of the embodiments below can be combined as appropriate. In the case where some structural examples are given in one embodiment, any of the structure examples can be combined as appropriate.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Unless otherwise specified, an on-state current in this specification refers to a drain current of a transistor in the on state. Unless otherwise specified, the on state of an n-channel transistor means that the voltage difference between its gate and source ($V_{gs}$) is higher than or equal to the threshold voltage ($V_{th}$), and the on state of a p-channel transistor means that $V_{gs}$ is lower than or equal to $V_{th}$. For example, the on-state current of an n-channel transistor sometimes refers to a drain current that flows when $V_{gs}$ is higher than or equal to $V_{th}$. The on-state current of a transistor depends on voltage ($V_{ds}$) between its drain and source in some cases.

Unless otherwise specified, the off-state current in this specification refers to a drain current of a transistor in the off state. Unless otherwise specified, the off state of an n-channel transistor means that $V_{gs}$ is lower than $V_{th}$, and the off state of a p-channel transistor means that $V_{gs}$ is higher than $V_{th}$. For example, the off-state current of an n-channel transistor sometimes refers to a drain current that flows when $V_{gs}$ is lower than $V_{th}$. The off-state current of a transistor depends on $V_{gs}$ in some cases. Thus, "the off-state current of a transistor is lower than $10^{-21}$ A" may mean there is $V_{gs}$ at which the off-state current of the transistor is lower than $10^{-21}$ A.

The off-state current of a transistor depends on $V_{ds}$ in some cases. Unless otherwise specified, the off-state current in this specification may be an off-state current at $V_{ds}$ whose absolute value is 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ used in a semiconductor device or the like including the transistor.

In this specification and the like, the terms "one of a source and a drain" (or first electrode or first terminal) and "the other of the source and the drain" (or second electrode or second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification, a high power supply potential is referred to as an H level (or $V_{DD}$), and a low power supply potential is referred to as an L level (or GND), in some cases.

Embodiment 1

FIGS. 1A to 1D each illustrate an example of a circuit configuration of a semiconductor device of one embodiment of the present invention.

<<Semiconductor Device 10a>>

A semiconductor device 10a illustrated in FIG. 1A includes a transistor N1, a transistor N2, a transistor N3, a wiring L1, and a wiring L2. The transistor N1, the transistor N2, and the transistor N3 are n-channel transistors. The wiring L1 and the wiring L2 are supplied with a high power supply potential ($V_{DD}$) and a low power supply potential (GND), respectively.

The transistor N1 includes a first gate and a second gate. In the transistor N1, the first gate and the second gate preferably overlap with each other with a semiconductor therebetween.

The first gate of the transistor N1 is electrically connected to a first terminal of the transistor N1. The second gate of the transistor N1 is electrically connected to a second terminal of the transistor N1. The first terminal of the transistor N1 is electrically connected to the wiring L1. The second terminal of the transistor N1 is electrically connected to the wiring L2 through the transistor N2 and the transistor N3.

In the semiconductor device 10a, data A is input to a gate of the transistor N2, data B is input to a gate of the transistor N3, and data Z is output from the second terminal of the transistor N1. Note that the data A, the data B, and the data Z are each of a Boolean data type having a value of "0" or "1". In this case, the semiconductor device 10a has a function of outputting, as the data Z, data denoted by NOT(A×B). Note that "NOT" means logical negation. That is, the semiconductor device 10a functions as a NAND circuit.

For example, when A=1 and B=1 are input, the transistor N2 and the transistor N3 are turned on and the semiconductor device 10a outputs Z=0.

For example, when A=1 and B=0 are input, the transistor N2 is turned on and the transistor N3 is turned off, and the semiconductor device 10a outputs Z=1.

For example, when A=0 and B=0 are input, the transistor N2 and the transistor N3 are turned off and the semiconductor device 10a outputs Z=1.

Next, a semiconductor device 10c illustrated in FIG. 2A will be described to show the effect of the second gate of the transistor N1. The semiconductor device 10c is different from the semiconductor device 10a in that the transistor N1 does not include the second gate.

When A=0 and B=0 are input to the semiconductor device 10c, the transistor N2 and the transistor N3 are turned off. Since the transistor N1 remains on, the potential of a node 1 (illustrated in the drawing) is increased; however, the potential of the node 1 is increased to $V_{DD}$-$V_{th}$ at most because the transistor N1 is an n-channel transistor. Note that $V_{th}$ denotes the threshold voltage of the transistor N1. The semiconductor device 10c cannot output $V_{DD}$ as the data Z. In other words, the semiconductor device 10c cannot properly output Z=1.

When A=0 and B=0 are input to the semiconductor device 10a, the potential of the second gate of the transistor N1 is increased as well as the potential of the node 1 and the threshold voltage of the transistor N1 becomes low. As a result, $V_{DD}$ is supplied as the data Z, and thus the semiconductor device 10a can properly output Z=1 (FIG. 2B). Since the threshold voltage of the transistor N1 becomes low, the on-state current of the transistor N1 can be large. Accordingly, the semiconductor device 10a can operate at high speed.

As each of the transistors N1 to N3, for example, a transistor including an oxide semiconductor in a channel formation region (hereinafter, referred to as an OS transistor) or a transistor including a wide bandgap semiconductor in a channel formation region is preferably used. In particular, an OS transistor is preferably used. Note that in this specification, a wide bandgap semiconductor means a semiconductor having a bandgap of 2.2 eV or more. For example, silicon carbide, gallium nitride, diamond, and the like can be given.

The off-state current is small and the withstand voltage between a source and a drain is high in an OS transistor and a transistor including a wide bandgap semiconductor even in the case where these transistors are miniaturized. For that reason, the semiconductor device 10a and a high-voltage circuit can be easily connected. The semiconductor device 10a can operate in a high-temperature environment because the off-state current remains small even in such an environment.

<<Semiconductor Device 11a>>

Figure 1B:
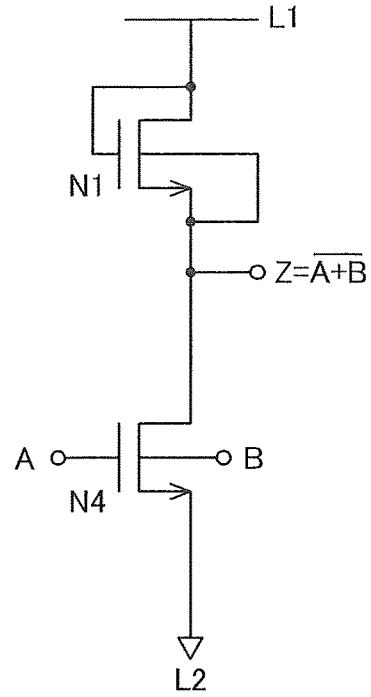

A semiconductor device 11a illustrated in FIG. 1B is different from the semiconductor device 10a in that a transistor N4 is used instead of the transistor N2 and the transistor N3. The transistor N4 is an n-channel transistor.

The transistor N4 includes a first gate and a second gate. In the transistor N4, the first gate and the second gate preferably overlap with each other with a semiconductor therebetween.

In the semiconductor device 11a, data A is input to the first gate of the transistor N4, data B is input to the second gate of the transistor N4, and data Z is output from a second terminal of the transistor N1. In this case, the semiconductor device 11a has a function of outputting, as the data Z, data denoted by NOT(A+B). That is, the semiconductor device 11a functions as a NOR circuit.

For example, when A=1 and B=1 are input, the transistor N4 is turned on and the semiconductor device 11a outputs Z=0.

For example, when A=1 and B=0 are input, the transistor N4 is turned on and the semiconductor device 11a outputs Z=0.

For example, when A=0 and B=0 are input, the transistor N4 is turned off and the semiconductor device 11a outputs Z=1.

As in the case of the semiconductor device 10a, for example, an OS transistor or a transistor including a wide bandgap semiconductor in a channel formation region is preferably used as the transistor N4. In particular, an OS transistor is preferably used.

Like the semiconductor device 10a, the semiconductor device 11a can properly output Z=1 because the transistor N1 includes the second gate. Furthermore, the semiconductor device 11a can operate at high speed.

<<Semiconductor Device 12a>>

Figure 1C:
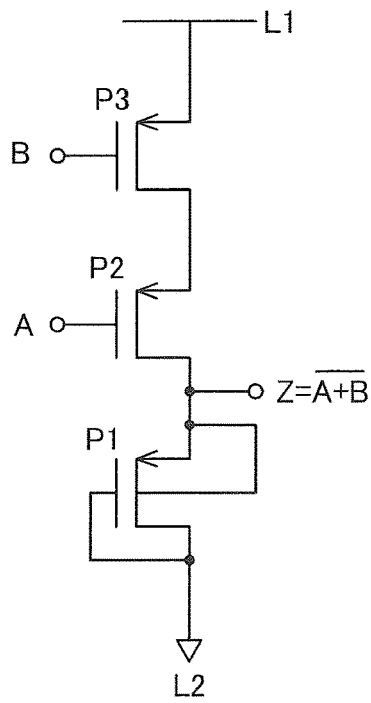

A semiconductor device 12a illustrated in FIG. 1C includes a transistor P1, a transistor P2, a transistor P3, a wiring L1, and a wiring L2. The transistor P1, the transistor P2, and the transistor P3 are p-channel transistors. The wiring L1 and the wiring L2 are supplied with a high power supply potential ($V_{DD}$) and a low power supply potential (GND), respectively.

The transistor P1 includes a first gate and a second gate. In the transistor P1, the first gate and the second gate preferably overlap with each other with a semiconductor therebetween.

The first gate of the transistor P1 is electrically connected to a first terminal of the transistor P1. The second gate of the transistor P1 is electrically connected to a second terminal of the transistor P1. The first terminal of the transistor P1 is electrically connected to the wiring L2. The second terminal of the transistor P1 is electrically connected to the wiring L1 through the transistor P2 and the transistor P3.

In the semiconductor device 12a, data A is input to a gate of the transistor P2, data B is input to a gate of the transistor P3, and data Z is output from the second terminal of the transistor P1. In this case, the semiconductor device 12a has a function of outputting, as the data Z, data denoted by NOT(A+B). That is, the semiconductor device 12a functions as a NOR circuit.

For example, when A=0 and B=0 are input, the transistor P2 and the transistor P3 are turned on and the semiconductor device 12a outputs Z=1.

For example, when A=1 and B=0 are input, the transistor P2 is turned off and the transistor P3 is turned on, and the semiconductor device 12a outputs Z=0.

For example, when A=1 and B=1 are input, the transistor P2 and the transistor P3 are turned off and the semiconductor device 12a outputs Z=0.

In the semiconductor device 12a, the transistor P1 preferably includes the second gate as in the case of the semiconductor device 10a in order that the semiconductor device 12a can properly output Z=0 and can operate at high speed.

<<Semiconductor Device 13a>>

Figure 1D:
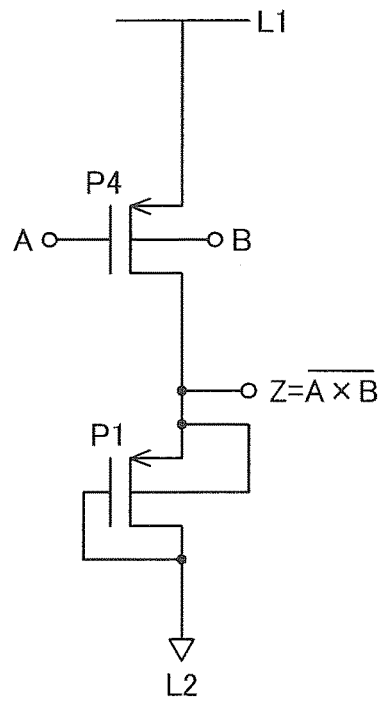

A semiconductor device 13a illustrated in FIG. 1D is different from the semiconductor device 12a in that a transistor P4 is used instead of the transistor P2 and the transistor P3. The transistor P4 is a p-channel transistor.

The transistor P4 includes a first gate and a second gate. In the transistor P4, the first gate and the second gate preferably overlap with each other with a semiconductor therebetween.

In the semiconductor device 13a, data A is input to the first gate of the transistor P4, data B is input to the second gate of the transistor P4, and data Z is output from a second terminal of the transistor P1. In this case, the semiconductor device 13a has a function of outputting, as the data Z, data denoted by NOT(A×B). That is, the semiconductor device 13a functions as a NAND circuit.

For example, when A=0 and B=0 are input, the transistor P4 is turned on and the semiconductor device 13a outputs Z=1.

For example, when A=0 and B=1 are input, the transistor P4 is turned on and the semiconductor device 13a outputs Z=1.

For example, when A=1 and B=1 are input, the transistor P4 is turned on and the semiconductor device 13a outputs Z=0.

In the semiconductor device 13a, the transistor P1 preferably includes a second gate as in the case of the semiconductor device 10a in order that the semiconductor device 13a can properly output Z=0 and can operate at high speed.

Figure 3A:
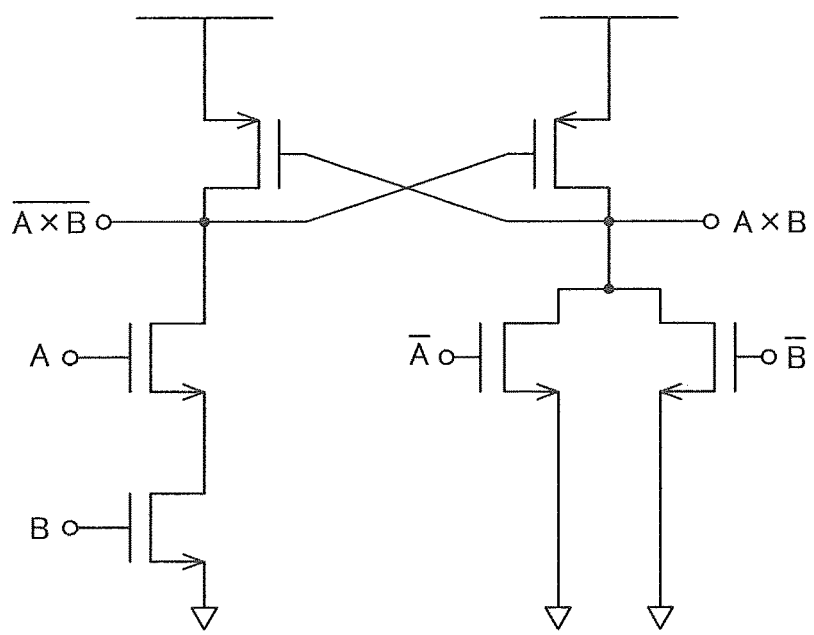
FIG. 3A is a circuit diagram of a CVSL.
Figure 3B:
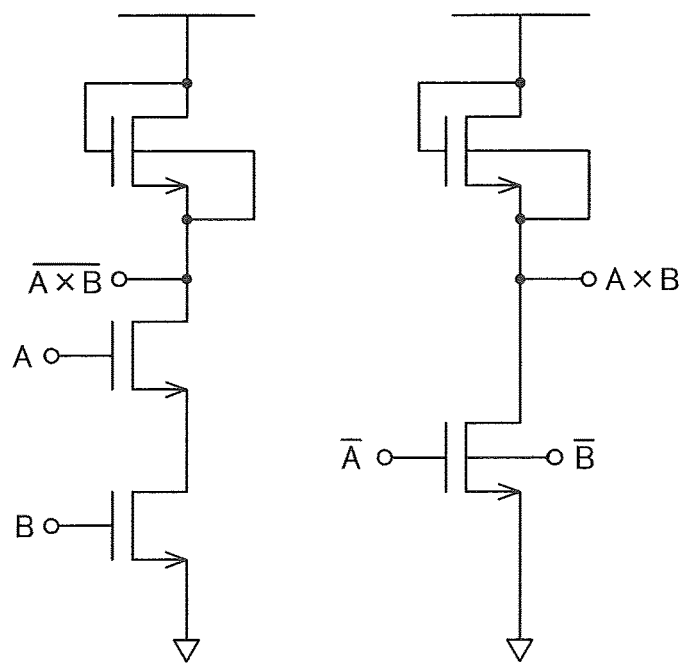
FIG. 3B is a circuit diagram illustrating one embodiment of a semiconductor device performing the same logic operation as the CVSL.

A CVSL illustrated in FIG. 3A can be formed using the semiconductor device 10a and the semiconductor device 11a. FIG. 3B is a circuit diagram in that case. The number of transistors in FIG. 3B is smaller than that in FIG. 3A by one. Since the configuration in FIG. 3B includes two independent circuits, the degree of freedom in circuit arrangement is high. This applies to the case where a CVSL is formed using the semiconductor device 12a and the semiconductor device 13a. That is, with the use of the semiconductor device 10a, 11a, 12a, or 13a, the number of transistors in a logic circuit can be small.

In each of the semiconductor devices 10a, 11a, 12a, and 13a, either n-channel transistors or p-channel transistors are used; thus, the manufacturing process can be simpler than that of a semiconductor device formed using a CMOS circuit.

<<Semiconductor Device 10b>>

Figure 4A:
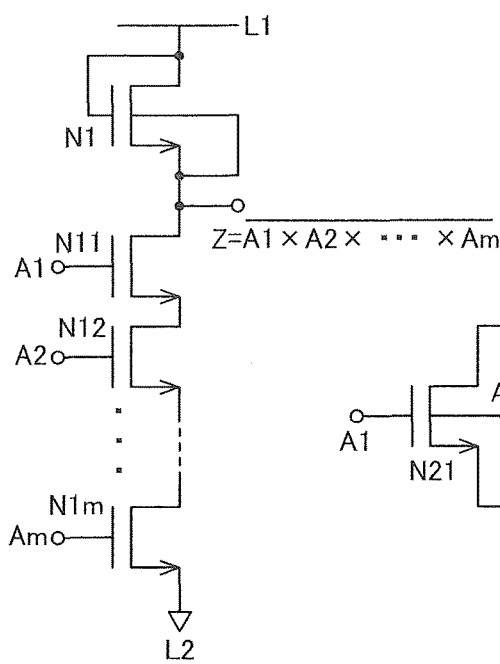
FIGS. 4A to 4D are circuit diagrams each illustrating one embodiment of a semiconductor device.

A semiconductor device 10b illustrated in FIG. 4A is different from the semiconductor device 10a illustrated in FIG. 1A in that transistors N11 to N1m (in is an integer of 2 or more) connected in series are used instead of the transistors N2 and N3. The transistors N11 to N1m are n-channel transistors.

Data A1 is input to a gate of the transistor N11, and data A2 is input to a gate of the transistor N12; similarly, data Am is input to a gate of the transistor N1m. In this case, as data Z, the NAND of the data A1 to the data Am is output.

As each of the transistors N11 to N1m, for example, an OS transistor or a transistor including a wide bandgap semiconductor in a channel formation region is preferably used. In particular, an OS transistor is preferably used.

<Semiconductor Device 11b>

Figure 4B:
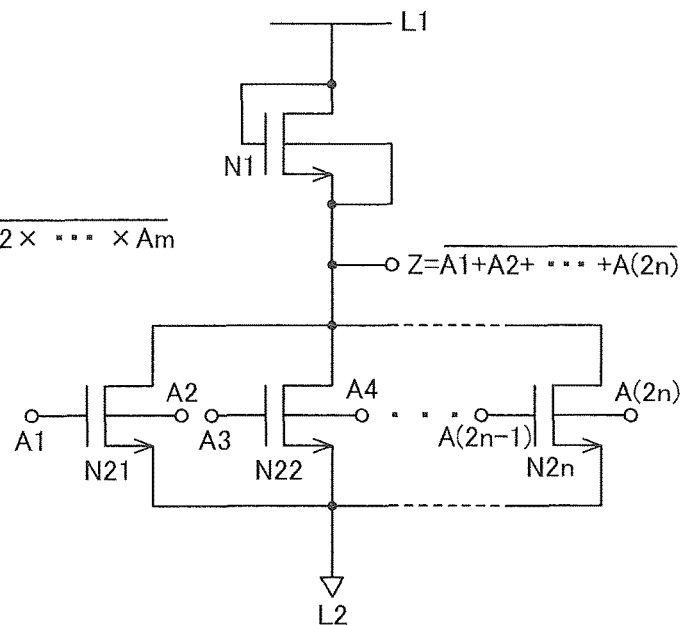

A semiconductor device 11b illustrated in FIG. 4B is different from the semiconductor device 11a illustrated in FIG. 1B in that transistors N21 to N2n (n is an integer of 2 or more) connected in parallel are used instead of the transistor N4. The transistors N21 to N2n each include a first gate and a second gate. The transistors N21 to N2n are n-channel transistors.

Data A1 is input to the first gate of the transistor N21, and data A2 is input to the second gate of the transistor N21. Data A3 is input to the first gate of the transistor N22, and data A4 is input to the second gate of the transistor N22. In a similar manner, data A(2n−1) is input to the first gate of the transistor N2n, and data A(2n) is input to the second gate of the transistor N2n. In this case, as data Z, the NOR of the data A1 to the data A(2n) is output.

As each of the transistors N21 to N2n, for example, an OS transistor or a transistor including a wide bandgap semiconductor in a channel formation region is preferably used. In particular, an OS transistor is preferably used.

<<Semiconductor Device 12b>>

Figure 4C:
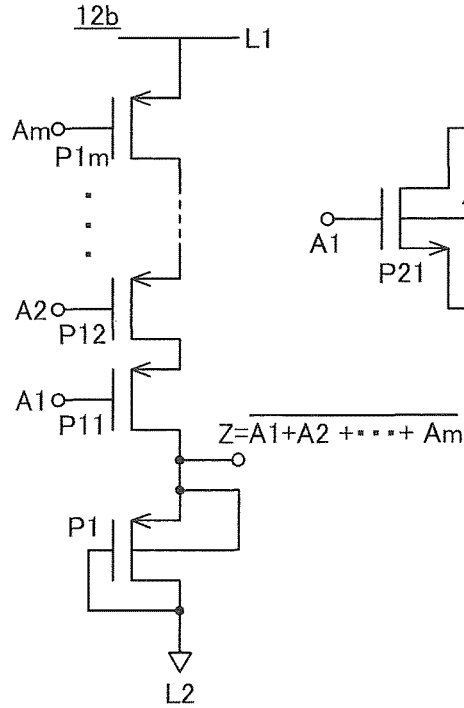

A semiconductor device 12b illustrated in FIG. 4C is different from the semiconductor device 12a illustrated in FIG. 1C in that transistors P11 to P1m connected in series are used instead of the transistors P2 and P3. The transistors P11 to P1m are p-channel transistors.

Data A1 is input to a gate of the transistor P11, and data A2 is input to a gate of the transistor P12; similarly, data Am is input to a gate of the transistor P1m. In this case, as data Z, the NOR of the data A1 to the data Am is output.

<<Semiconductor Device 13b>>

Figure 4D:
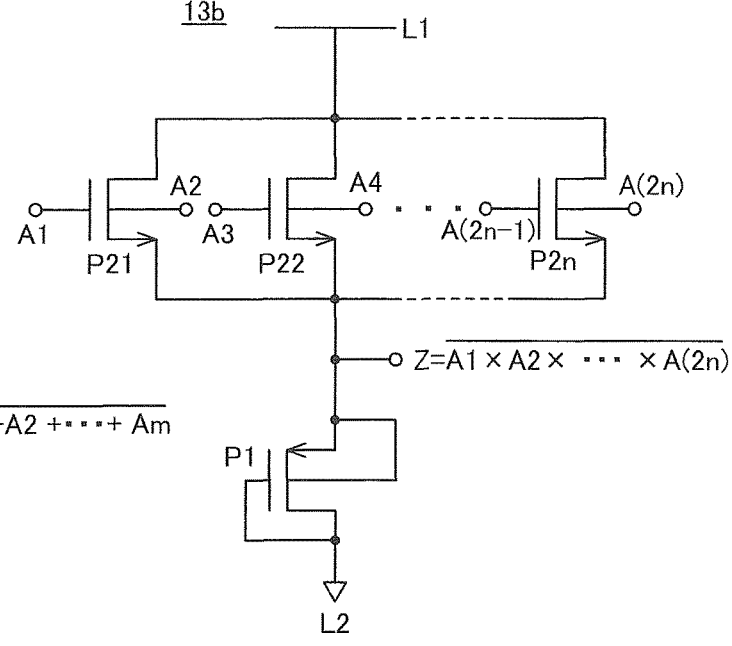

A semiconductor device 13b illustrated in FIG. 4D is different from the semiconductor device 13a illustrated in FIG. 1D in that transistors P21 to P2n connected in parallel are used instead of the transistor P4. The transistors P21 to P2n each include a first gate and a second gate. The transistors P21 to P2n are p-channel transistors.

Data A1 is input to the first gate of the transistor P21, and data A2 is input to the second gate of the transistor P21. Data A3 is input to the first gate of the transistor P22, and data A4 is input to the second gate of the transistor P22. In a similar manner, data A(2n−1) is input to the first gate of the transistor P2n, and data A(2n) is input to the second gate of the transistor P2n. In this case, as data Z, the NAND of the data A1 to the data A(2n) is output.

Figure 5A:
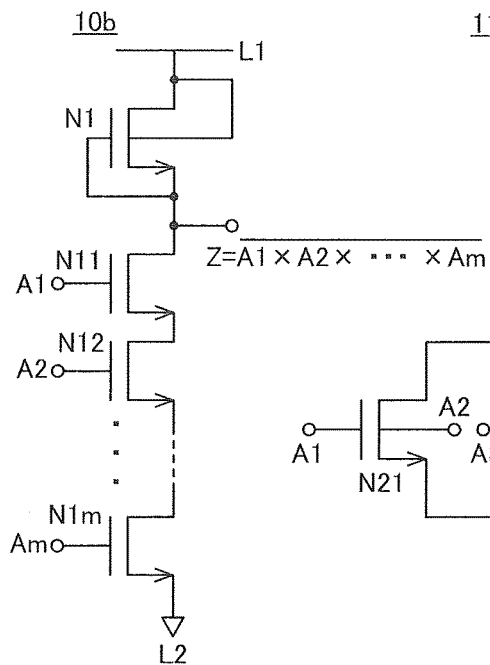
FIGS. 5A to 5D are circuit diagrams each illustrating one embodiment of a semiconductor device.

The semiconductor device 10b illustrated in FIG. 4A may alternatively have a configuration in which the first gate of the transistor N1 is connected to a second terminal of the transistor N1 and the second gate of the transistor N1 is connected to a first terminal of the transistor N1. FIG. 5A is a circuit diagram in that case.

Figure 5B:
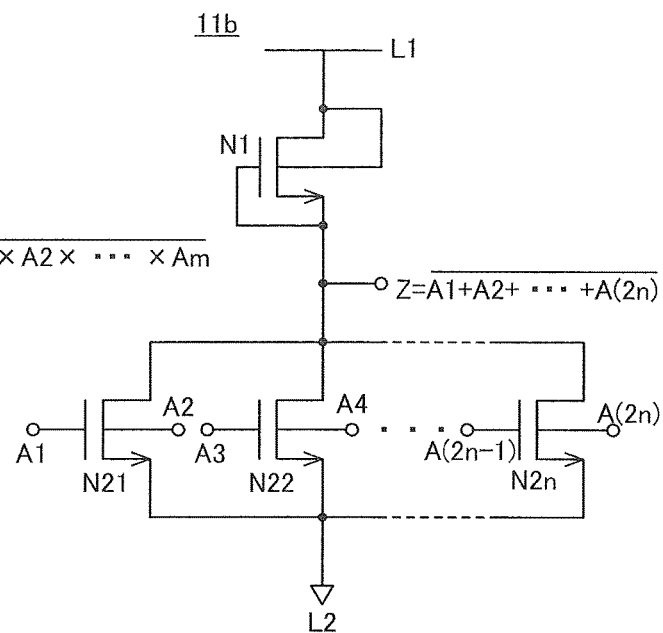

The semiconductor device 11b illustrated in FIG. 4B may alternatively have a configuration in which the first gate of the transistor N1 is connected to a second terminal of the transistor N1 and the second gate of the transistor N1 is connected to a first terminal of the transistor N1. FIG. 5B is a circuit diagram in that case.

Figure 5C:
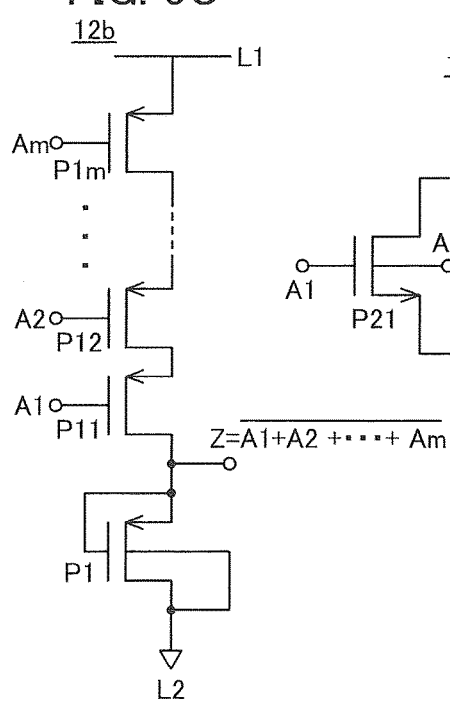

The semiconductor device 12b illustrated in FIG. 4C may alternatively have a configuration in which the first gate of the transistor P1 is connected to a second terminal of the transistor P1 and the second gate of the transistor P1 is connected to a first terminal of the transistor P1. FIG. 5C is a circuit diagram in that case.

Figure 5D:
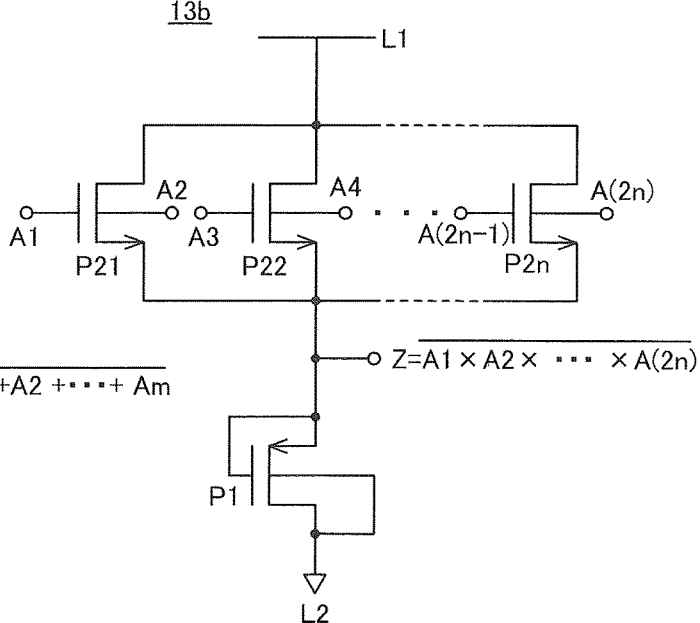

The semiconductor device 13b illustrated in FIG. 4D may alternatively have a configuration in which the first gate of the transistor P1 is connected to a second terminal of the transistor P1 and the second gate of the transistor P1 is connected to a first terminal of the transistor P1. FIG. 5D is a circuit diagram in that case.

<<Semiconductor Device 14>>

Figure 6A:
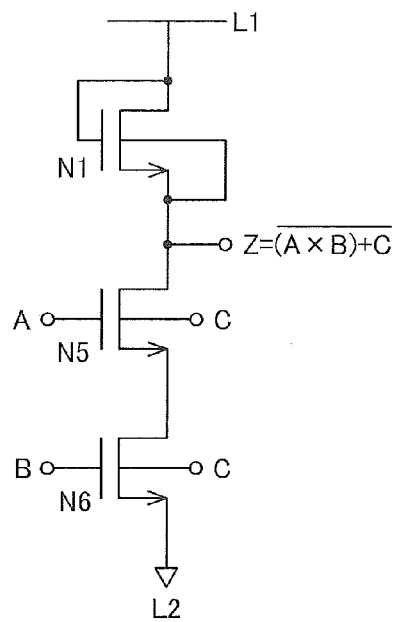
FIGS. 6A to 6D are circuit diagrams each illustrating one embodiment of a semiconductor device.

A semiconductor device 14 illustrated in FIG. 6A is different from the semiconductor device 10a illustrated in FIG. 1A in that transistors N5 and N6 connected in series are used instead of the transistors N2 and N3. The transistors N5 and N6 each include a first gate and a second gate. In the transistor N5, the first gate and the second gate preferably overlap with each other with a semiconductor therebetween. In a similar manner, in the transistor N6, the first gate and the second gate preferably overlap with each other with a semiconductor therebetween. The transistors N5 and N6 are n-channel transistors.

As each of the transistors N5 and N6, for example, an OS transistor or a transistor including a wide bandgap semiconductor in a channel formation region is preferably used. In particular, an OS transistor is preferably used.

Data A is input to the first gate of the transistor N5, and data C is input to the second gate of the transistor N5. Data B is input to the first gate of the transistor N6, and the data C is input to the second gate of the transistor N6. In this case, as data Z, data denoted by NOT((A×B)+C) is output. Like other data, the data C is of a Boolean data type having a value of "0" or "1".

<<Semiconductor Device 15>>

Figure 6B:
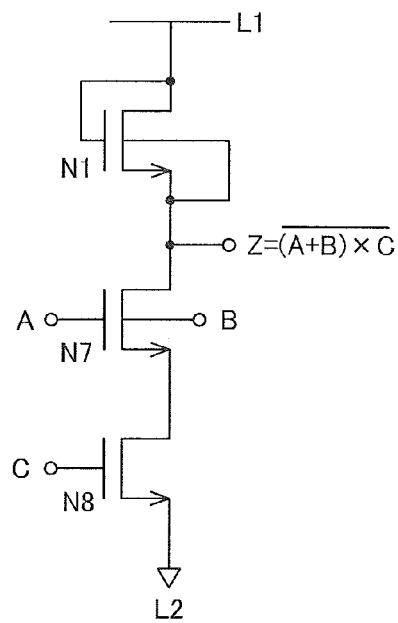

A semiconductor device 15 illustrated in FIG. 6B is different from the semiconductor device 14 in that transistors N7 and N8 connected in series are used instead of the transistors N5 and N6. The transistor N7 includes a first gate and a second gate. In the transistor N7, the first gate and the second gate preferably overlap with each other with a semiconductor therebetween. The transistors N7 and N8 are n-channel transistors.

As each of the transistors N7 and N8, for example, an OS transistor or a transistor including a wide bandgap semiconductor in a channel formation region is preferably used. In particular, an OS transistor is preferably used.

Data A is input to the first gate of the transistor N7, and data B is input to the second gate of the transistor N7. Data C is input to a gate of the transistor N8. In this case, as data Z, data denoted by NOT((A+B)×C) is output.

<<Semiconductor Device 16>>

Figure 6C:
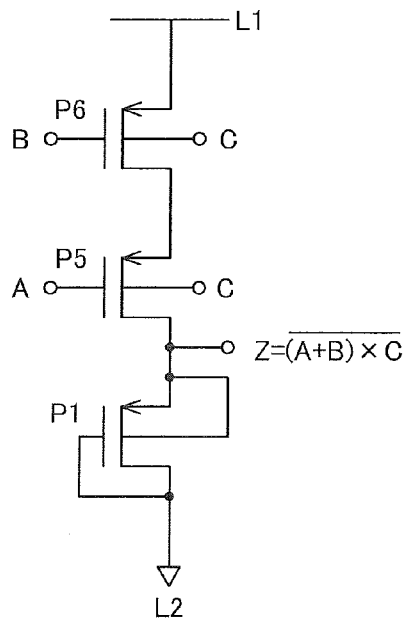

A semiconductor device 16 illustrated in FIG. 6C is different from the semiconductor device 12a illustrated in FIG. 1C in that transistors P5 and P6 connected in series are used instead of the transistors P2 and P3. The transistors P5 and P6 each include a first gate and a second gate. In the transistor P5, the first gate and the second gate preferably overlap with each other with a semiconductor therebetween. In a similar manner, in the transistor P6, the first gate and the second gate preferably overlap with each other with a semiconductor therebetween. The transistors P5 and P6 are p-channel transistors.

Data A is input to the first gate of the transistor P5, and data C is input to the second gate of the transistor P5. Data B is input to the first gate of the transistor P6, and the data C is input to the second gate of the transistor P6. In this case, as data Z, data denoted by NOT((A+B)×C) is output.

<<Semiconductor Device 17>>

Figure 6D:
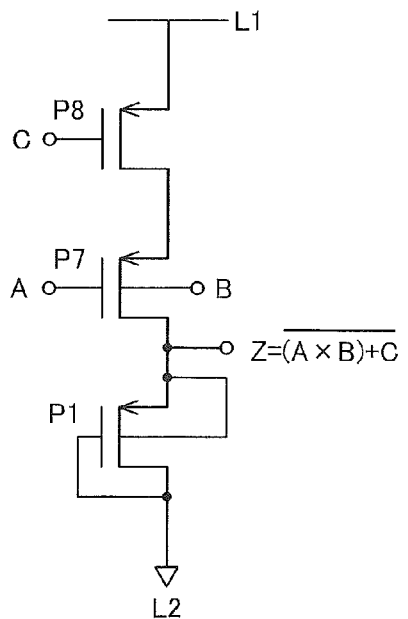

A semiconductor device 17 illustrated in FIG. 6D is different from the semiconductor device 16 in that transistors P7 and P8 connected in series are used instead of the transistors P5 and P6. The transistor P7 includes a first gate and a second gate. In the transistor P7, the first gate and the second gate preferably overlap with each other with a semiconductor therebetween. The transistors P7 and P8 are p-channel transistors.

Data A is input to the first gate of the transistor P7, and data B is input to the second gate of the transistor P7. Data C is input to a gate of the transistor P8. In this case, as data Z, data denoted by NOT((A×B)+C) is output.

Figure 7A:
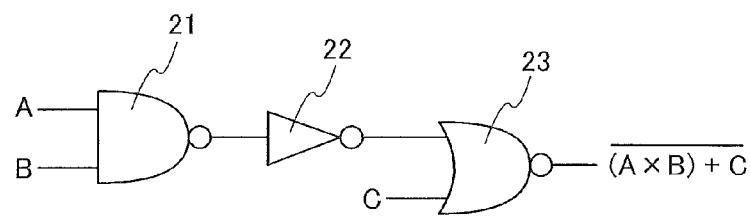
FIGS. 7A and 7B each illustrate a circuit formed using a CMOS logic circuit.
Figure 7B:
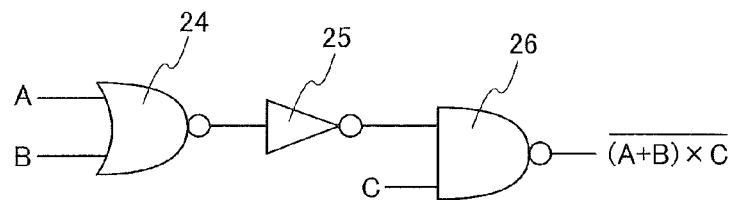

FIG. 7A is a circuit diagram in the case where a CMOS circuit performs the same logic operation as the semiconductor device 14 and the semiconductor device 17. FIG. 7B is a circuit diagram in the case where a CMOS circuit performs the same logic operation as the semiconductor device 15 and the semiconductor device 16.

In the circuit illustrated in FIG. 7A, a NAND 21, an inverter 22, and a NOR 23 are provided. In the circuit illustrated in FIG. 7B, a NOR 24, an inverter 25, and a NAND 26 are provided.

It can be seen from the comparison between the circuit diagrams of FIGS. 6A to 6D and the circuit diagrams of FIGS. 7A and 7B that the number of transistors in a logic circuit formed using the semiconductor device 14, 15, 16, or 17 can be smaller than that in a logic circuit formed using the CMOS circuit. The power consumption of the CMOS circuits illustrated in FIGS. 7A and 7B is high because leakage current is generated in logic gates. In contrast, the power consumption of the semiconductor devices 14 to 17 can be low because the number of logic gates is small and leakage current is low. Furthermore, the circuit areas of the semiconductor devices 14 to 17 can be small because the number of transistors is small. In each of the semiconductor devices 14, 15, 16, and 17, either n-channel transistors or p-channel transistors are used; thus, the manufacturing process can be simpler than that of a semiconductor device formed using a CMOS circuit.

Embodiment 2

In this embodiment, an OS transistor that can be used in the semiconductor device of Embodiment 1 will be described.

<<Structure Example 1 of Transistor>>

Figure 8A:
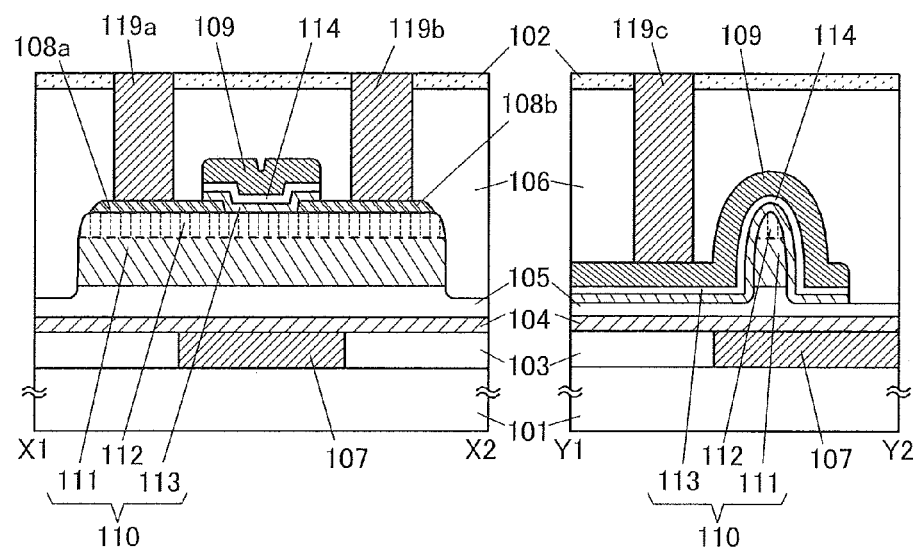
FIGS. 8A and 8B show cross-sectional views and a top view, respectively, illustrating one embodiment of a transistor.
Figure 8B:
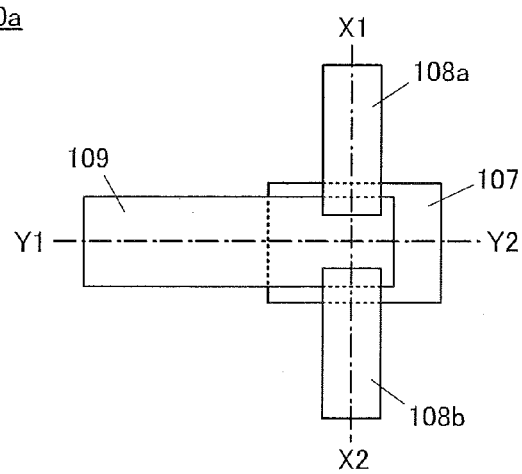

FIGS. 8A and 8B show cross-sectional views and a top view of a transistor 100a. FIG. 8B is a top view. A cross section taken along the dashed-dotted line X1-X2 in FIG. 8B is illustrated on the left side of FIG. 8A, and a cross section taken along the dashed-dotted line Y1-Y2 in FIG. 8B is illustrated on the right side of FIG. 8A. Note that for simplification of the drawings, some components are increased or reduced in size, or omitted in FIGS. 8A and 8B. The direction of the dashed-dotted line X1-X2 may be called a channel length direction, and the direction of the dashed-dotted line Y1-Y2 may be called a channel width direction.

Note that the channel length refers to, for example, a distance between a source (a source region or a source electrode) and a drain (a drain region or a drain electrode) in a region where a semiconductor (or a portion where current flows in a semiconductor when the transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of the transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

The transistor 100a includes a substrate 101; a conductor 107 formed over the substrate 101; an insulator 103 formed so as to cover the conductor 107; an insulator 104 formed over the insulator 103; an insulator 105 formed over the insulator 104; a stack over the insulator 105, in which a semiconductor 111 and a semiconductor 112 are sequentially formed; a conductor 108a and a conductor 108b in contact with a top surface of the semiconductor 112; a semiconductor 113 in contact with the semiconductor 111, the semiconductor 112, the conductor 108a, and the conductor 108b; an insulator 114 and a conductor 109 over the semiconductor 113; and an insulator 106 and an insulator 102 over the conductor 109. Note that the semiconductor 111, the semiconductor 112, and the semiconductor 113 are collectively referred to as a semiconductor 110.

The conductor 108a serves as one of a source and a drain of the transistor 100a. The conductor 108b serves as the other of the source and the drain of the transistor 100a.

The conductor 109 serves as a first gate of the transistor 100a.

The insulator 114 serves as a first gate insulator of the transistor 100a.

The conductor 107 serves as a second gate of the transistor 100a. Note that the conductor 107 may be provided as necessary and can be omitted in some cases.

The insulators 103 to 105 serve as a base insulator. The insulators 104 and 105 also serve as a second gate insulator of the transistor 100a.

The insulator 106 serves as an interlayer insulator.

The insulator 102 serves as a protective insulator.

As illustrated in FIG. 8A, the side surface of the semiconductor 112 is surrounded by the conductor 109. With this structure, the semiconductor 112 can be electrically surrounded by an electric field of the conductor 109 (Such a structure of a transistor in which a semiconductor is electrically surrounded by an electric field of a conductor (gate electrode) is referred to as a surrounded channel (s-channel) structure). Therefore, a channel is formed in the entire semiconductor 112 (bulk) in some cases. In the s-channel structure, a large amount of current can flow between a source and a drain of a transistor, so that high current in an on state (on-state current) can be achieved. The s-channel structure enables a transistor to operate at high frequency.

The s-channel structure, because of its high on-state current, is suitable for a semiconductor device which requires a miniaturized transistor, such as a large-scale integrated (LSI) circuit. A semiconductor device including the miniaturized transistor can have a high integration degree and high density. The transistor preferably has, for example, a region where a channel length is greater than or equal to 10 urn and less than 1 μm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm. In addition, the transistor preferably has, for example, a region where a channel width is greater than or equal to 10 nm and less than 1 μm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm.

Furthermore, the s-channel structure is suitable for a transistor that needs to operate at high frequency because of its high on-state current. A semiconductor device including the transistor can operate at high frequency.

Components of the transistor 100a will be described below.

<Semiconductor>

First, a semiconductor that can be used as the semiconductors 111 to 113 will be described.

The semiconductor 112 is an oxide semiconductor containing indium (In), for example. The semiconductor 112 can have high carrier mobility (electron mobility) by containing indium, for example. The semiconductor 112 preferably contains an element M. The element M is preferably aluminum (Al), gallium (Ga), tin (Sn), or the like. Other elements that can be used as the element M are, for example, boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 112 preferably contains zinc (Zn). When containing zinc, the oxide semiconductor is easily crystallized in some cases.

Note that the semiconductor 112 is not limited to the oxide semiconductor containing indium. The semiconductor 112 may be an oxide semiconductor that does not contain indium and contains at least one of zinc, gallium, and tin (e.g., a zinc tin oxide or a gallium tin oxide).

For the semiconductor 112, an oxide semiconductor with a wide energy gap is used, for example. The energy gap of the semiconductor 112 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor 112 is preferably a CAAC-OS film which is described later.

The semiconductors 111 and 113 include, for example, one or more, or two or more elements other than oxygen included in the semiconductor 112. Since the semiconductors 111 and 113 include one or more, or two or more elements other than oxygen included in the semiconductor 112, an interface state is less likely to be formed at an interface between the semiconductors 111 and 112 and an interface between the semiconductors 112 and 113.

In the case of using an In-M-Zn oxide as the semiconductor 111 or the semiconductor 113, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the semiconductor 111 or the semiconductor 113 is formed by a sputtering method, a sputtering target with the following atomic ratio is preferably used. For example, In:M:Zn is preferably 1:2:4, 1:3:2, 1:3:4, 1:3:6, 1:3:8, 1:4:3, 1:4:4, 1:4:5, 1:4:6, 1:6:3, 1:6:4, 1:6:5, 1:6:6, 1:6:7, 1:6:8, 1:6:9, 1:10:1, 1:5:6, or an atomic ratio that is in the neighborhood of any of the above atomic ratios.

The semiconductor 111 or the semiconductor 113 does not necessarily contain indium in some cases. For example, the semiconductor 111 or the semiconductor 113 may be gallium oxide or an M-Zn oxide. In the case where the M-Zn oxide is formed by a sputtering method, a sputtering target with a composition of M:Zn=10:1 or a composition in the neighborhood thereof is preferably used.

In the case of using an In-M-Zn oxide as the semiconductor 112, when the total proportion of In and M is assumed to be 100 atomic %, the proportions of In and Mare preferably set to be higher than 25 atomic % and lower than 75 atomic %, respectively, more preferably higher than 34 atomic % and lower than 66 atomic %, respectively. When the semiconductor 112 is formed by a sputtering method, a sputtering target with the following atomic ratio is preferably used. For example, In:M:Zn is preferably 1:1:1, 1:1:0.5, 1:1:1.2, 2:1:1.5, 2:1:2.3, 2:1:3, 3:1:2, 4:2:4.1, 5:1:7, or an atomic ratio which is in the neighborhood of any of the above atomic ratios.

The function and effect of the semiconductor 110, which includes a stack of the semiconductors 111 to 113, are described with reference to the energy band diagram of FIG.

Figure 9A:
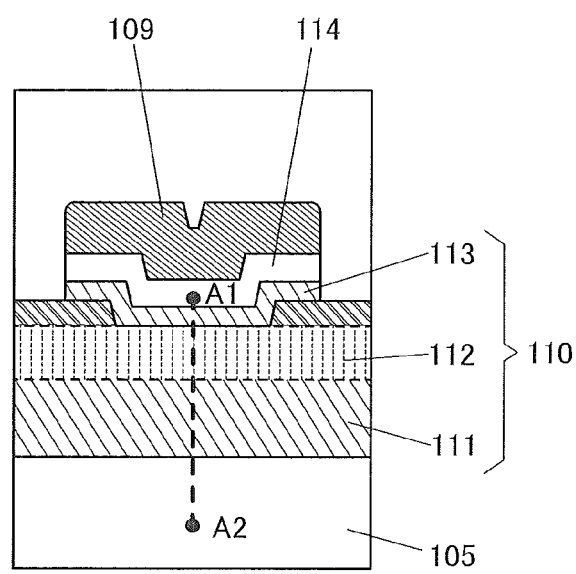
FIGS. 9A and 9B are a cross-sectional view and an energy band diagram, respectively, of a transistor.
Figure 9B:
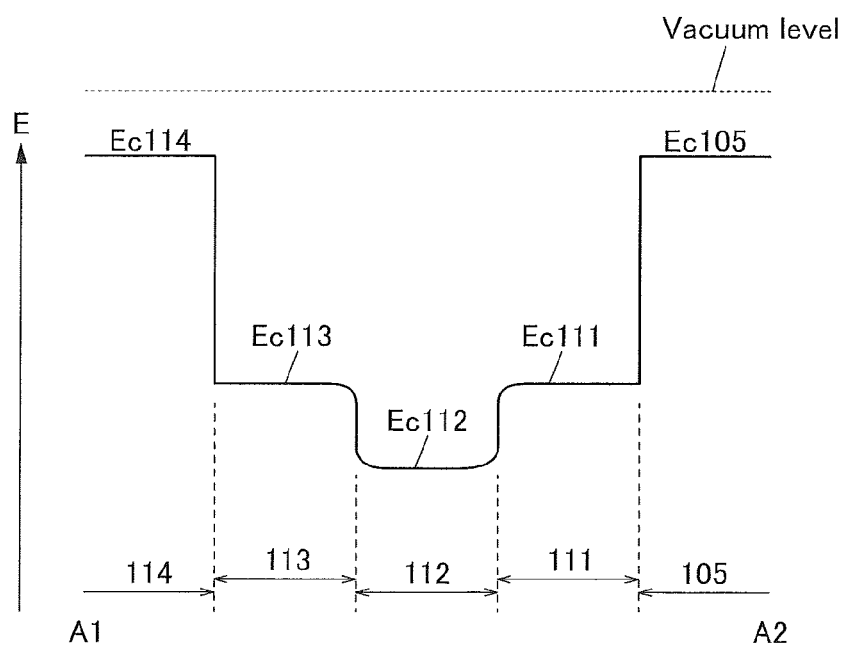

9B. FIG. 9B shows an energy band structure of a portion taken along dashed line A1-A2 in FIG. 9A.

In FIG. 9B, Ec105, Ec111, Ec112, Ec113, and Ec114 indicate the energies at the bottoms of the conduction bands of the insulator 105, the semiconductor 111, the semiconductor 112, the semiconductor 113, and the insulator 114, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulators 105 and 114 are insulators, Ec105 and Ec114 are closer to the vacuum level (i.e., have a lower electron affinity) than Ec111, Ec112, and Ec113.

The semiconductor 112 is an oxide semiconductor having an electron affinity higher than those of the semiconductors 111 and 113. For example, as the semiconductor 112, an oxide semiconductor having an electron affinity higher than those of the semiconductors 111 and 113 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy difference between the vacuum level and the bottom of the conduction band.

Indium gallium oxide has a low electron affinity and a high oxygen-blocking property. Therefore, the semiconductor 113 preferably contains indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the semiconductor 112 having the highest electron affinity among the semiconductors 111 to 113.

At this time, electrons move mainly in the semiconductor 112, not in the semiconductors 111 and 113. Hence, the on-state current of the transistor hardly varies even when the density of interface states, which inhibit electron movement, is high at the interface between the semiconductor 111 and the insulator 105 or at the interface between the semiconductor 113 and the insulator 114.

In some cases, there is a mixed region of the semiconductors 111 and 112 between the semiconductors 111 and 112. Furthermore, in some cases, there is a mixed region of the semiconductors 112 and 113 between the semiconductors 112 and 113. Because the mixed region has a low interface state density, a stack of the semiconductors 111 to 113 has a band structure where energy at each interface and in the vicinity of the interface is changed continuously (continuous junction).

As described above, the interface between the semiconductors 111 and 112 or the interface between the semiconductors 112 and 113 has a low interface state density. Hence, electron movement in the semiconductor 112 is less likely to be inhibited and the on-state current of the transistor can be increased.

Electron movement in the transistor is inhibited, for example, in the case where physical surface unevenness in a channel formation region is large. To increase the on-state current of the transistor, for example, the root mean square (RMS) roughness in a measurement area of 1 μm×1 μm of a top surface or a bottom surface of the semiconductor 112 (a formation surface; here, the top surface of the semiconductor 111) is less than 1 nm, preferably less than 0.6 nm, more preferably less than 0.5 nm, still more preferably less than 0.4 nm. The average surface roughness (Ra) in the measurement area of 1 μm×1 μm is less than 1 nm, preferably less than 0.6 nm, more preferably less than 0.5 nm, still more preferably less than 0.4 nm. The maximum peak-to-valley height (P-V) in the measurement area of 1 μm×1 μm is less than 10 nm, preferably less than 9 nm, more preferably less than 8 nm, still more preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the semiconductor 112 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 112, the on-state current of the transistor can be increased in some cases.

For example, at a certain depth in the semiconductor 112 or in a certain region of the semiconductor 112, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the semiconductor 112, for example, there is a method in which excess oxygen contained in the insulator 105 is moved to the semiconductor 112 through the semiconductor 111. In that case, the semiconductor 111 is preferably a layer having oxygen permeability (a layer through which oxygen passes or is transmitted).

Note that in the case where the transistor has an s-channel structure, a channel is formed in the entire semiconductor 112. Therefore, as the semiconductor 112 has a larger thickness, a channel region becomes larger. In other words, the thicker the semiconductor 112 is, the larger the on-state current of the transistor is.

Moreover, the thickness of the semiconductor 113 is preferably as small as possible to increase the on-state current of the transistor. For example, the semiconductor 113 has a region with a thickness of less than 10 nm, preferably less than or equal to 5 nm, more preferably less than or equal to 3 nm. Meanwhile, the semiconductor 113 has a function of blocking entry of elements other than oxygen (such as hydrogen and silicon) included in the adjacent insulator into the semiconductor 112 where a channel is formed. Thus, the semiconductor 113 preferably has a certain thickness. For example, the semiconductor 113 may have a region with a thickness of greater than or equal to 0.3 nm, preferably greater than or equal to 1 nm, more preferably greater than or equal to 2 nm. The semiconductor 113 preferably has an oxygen blocking property to inhibit outward diffusion of oxygen released from the insulator 105 and the like.

To improve reliability, preferably, the thickness of the semiconductor 111 is large and the thickness of the semiconductor 113 is small. For example, the semiconductor 111 has a region with a thickness of greater than or equal to 10 nm, preferably greater than or equal to 20 nm, more preferably greater than or equal to 40 nm, still more preferably greater than or equal to 60 am. An increase in the thickness of the semiconductor 111 can increase the distance from the interface between the adjacent insulator and the semiconductor 111 to the semiconductor 112 where a channel is formed. Note that the semiconductor 111 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the semiconductors 112 and 111. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the semiconductors 112 and 113. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the semiconductors 111 and 113 in order to reduce the concentration of hydrogen in the semiconductor 112. The semiconductors 111 and 113 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the semiconductors 111 and 113 in order to reduce the concentration of nitrogen in the semiconductor 112. The semiconductors 111 and 113 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The above three-layer structure is an example. For example, a two-layer structure without the semiconductor 111 or 113 may be employed. Alternatively, a four-layer structure may be employed in which one of the semiconductors given as examples of the semiconductors 111 to 113 is provided over or under the semiconductor 111 or over or under the semiconductor 113. Further alternatively, an n-layer structure (n is an integer of 5 or more) may be employed in which at least one of the semiconductors given as examples of the semiconductors 111 to 113 is provided at two or more of the following positions: over the semiconductor 111, under the semiconductor 111, over the semiconductor 113, and under the semiconductor 113.

<Substrate>

As the substrate 101, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, silicon carbide, silicon germanium, gallium arsenide, indium phosphide, zinc oxide, gallium oxide, or the like. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 101. As a method for providing a transistor over a flexible substrate, there is a method in which a transistor is formed over a non-flexible substrate, and then the transistor is separated and transferred to the substrate 101 that is a flexible substrate. In that case, a separation layer is preferably provided between the non-flexible substrate and the transistor. As the substrate 101, a sheet, a film, or foil containing a fiber may be used. The substrate 101 may have elasticity. The substrate 101 may have a property of returning to its original shape when bending or pulling is stopped. Alternatively, the substrate 101 may have a property of not returning to its original shape. The thickness of the substrate 101 is, for example, greater than or equal to 5 pin and less than or equal to 700 μm, preferably greater than or equal to 10 μm and less than or equal to 500 μm, more preferably greater than or equal to 15 μm and less than or equal to 300 μm. When the substrate 101 has small thickness, the weight of the semiconductor device can be reduced. When the substrate 101 has small thickness, even in the case of using glass or the like, the substrate 101 may have elasticity or a property of returning to its original shape when bending or pulling is stopped. Therefore, an impact applied to the semiconductor device over the substrate 101, which is caused by dropping or the like, can be reduced. That is, a durable semiconductor device can be provided. For the flexible substrate 101, a metal, an alloy, a resin, glass, or fiber thereof can be used, for example. The flexible substrate 101 preferably has a lower coefficient of linear expansion because deformation due to an environment is suppressed. The flexible substrate 101 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 101 because of its low coefficient of linear expansion.

<Base Insulator and Second Gate Insulator>

Examples of the material of the insulator 103 include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulator 103 may be formed using silicon oxide with high step coverage which is formed by reacting tetraethyl orthosilicate (TEOS), silane, or the like with oxygen, nitrous oxide, or the like.

The insulator 105 preferably contains an oxide material from which part of oxygen is released by heating. The insulator 105 preferably contains an oxide containing oxygen more than that in the stoichiometric composition. Part of oxygen is released by heating from an oxide film containing oxygen more than that in the stoichiometric composition. Oxygen released from the insulator 105 is supplied to the semiconductor 110, so that oxygen vacancies in the semiconductor 110 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulator 105 preferably contains an oxide that can supply oxygen to the semiconductor 110. For example, for the insulator 105, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulator 105.

To make the insulator 105 contain excess oxygen, the insulator 105 is formed in an oxygen atmosphere, for example. Alternatively, a region containing excess oxygen may be formed by introducing oxygen into the insulator 105 that has been formed. Both the methods may be combined.

For example, oxygen (at least including any of oxygen radicals, oxygen atoms, and oxygen ions) may be introduced into the insulator 105 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Furthermore, hydrogen or the like may be included. For example, a mixed gas of carbon dioxide, hydrogen, and argon may be used.

After the insulator 105 is formed, the insulator 105 may be subjected to planarization treatment using a chemical mechanical polishing (CMP) method or the like to improve the planarity of the top surface thereof.

The insulator 104 has a passivation function of preventing oxygen contained in the insulator 105 from decreasing by bonding to metal contained in the conductor 107.

The insulator 104 has a function of blocking oxygen, hydrogen, water, alkali metal, alkaline earth metal, and the like. Providing the insulator 104 can prevent outward diffusion of oxygen from the semiconductor 110 and entry of hydrogen, water, or the like into the semiconductor 110 from the outside.

The insulator 104 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

The threshold voltage of the transistor 100a can be controlled by injecting electrons into a charge trap layer. The charge trap layer is preferably provided in the insulator 104. For example, when the insulator 104 is formed using hafnium oxide, aluminum oxide, tantalum oxide, aluminum silicate, or the like, the insulator 104 can function as a charge trap layer.

<Gates, Source, and Drain>

The conductors 107, 109, 108a, and 108b each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductor is preferably formed using a low-resistance conductive material such as aluminum or copper.

In the case where the conductors 107, 109, 108a, and 108b are each formed using any of the high-melting-point materials or the low-resistance conductive materials, a metal nitride such as tantalum nitride or titanium nitride having a function of blocking oxygen or hydrogen is preferably provided thereunder or thereover.

For the conductors 107, 109, 108a, and 108b, a transparent conductive material containing indium oxide, tin oxide, or zinc oxide can also be used. Examples of the transparent conductive material include indium oxide, indium tin oxide (ITO), indium zinc oxide, zinc oxide, and zinc oxide to which gallium is added.

Alternatively, a stack of any of the above metals and any of the above transparent conductive materials may be used for the conductors 107, 109, 108a, and 108b.

<Plugs>

Plugs 119a and 119b each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the plugs are preferably formed using a low-resistance conductive material such as aluminum or copper.

<First Gate Insulator>

The insulator 114 preferably contains an insulator with a high relative dielectric constant. For example, the insulator 114 preferably contains silicon oxide, silicon oxynitride, silicon nitride, silicon nitride oxide, gallium oxide, hafnium oxide, an oxide containing aluminum and hafnium, oxynitride containing aluminum and hafnium, an oxide containing silicon and hafnium, oxynitride containing silicon and hafnium, or the like. Note that in this specification, an oxynitride refers to a compound that contains more oxygen than nitrogen, and a nitride oxide refers to a compound that contains more nitrogen than oxygen.

The insulator 114 preferably has a layered structure containing silicon oxide or silicon oxynitride and an insulator with a high relative dielectric constant. Because silicon oxide and silicon oxynitride have thermal stability, a combination of silicon oxide or silicon oxynitride with an insulator with a high relative dielectric constant allows the layered structure to be thermally stable and have a high relative dielectric constant.

<Interlayer Insulator>

The insulator 106 preferably contains an insulator with a low relative dielectric constant. For example, the insulator 106 preferably contains silicon oxide, silicon oxynitride, silicon nitride oxide, silicon nitride, or a resin. Alternatively, the insulator 106 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

<Protective Insulator>

The insulator 102 preferably has a function of blocking oxygen, hydrogen, water, alkali metal, alkaline earth metal, and the like. Providing the insulator 102 can prevent outward diffusion of oxygen from the transistor 100a and entry of hydrogen, water, or the like into the transistor 100a from the outside.

The insulator 102 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride. An aluminum oxide film is particularly preferably used because it is highly effective in preventing permeation of both oxygen and impurities such as hydrogen and moisture.

<<Structure Example 2 of Transistor>>

In the transistor 100a illustrated in FIG. 8A, the semiconductor 113 and the insulator 114 may be provided such that their end portions do not overlap with an end portion of the conductor 109. Structure examples in that case are illustrated in FIGS. 10A and 10B. A transistor 100b illustrated in FIG. 10A and a transistor 100c illustrated in FIG. 10B are different from each other in the formation methods of the semiconductor 113 and the insulator 114. The transistor 100b and the transistor 100c are preferable in that leakage current flowing between the conductor 109 and the conductor 108a or between the conductor 109 and the conductor 108b can be reduced.

The description of the transistor 100a can be referred to for the other components of the transistor 100b and the transistor 100c.

<<Structure Example 3 of Transistor>>

Figure 11A:
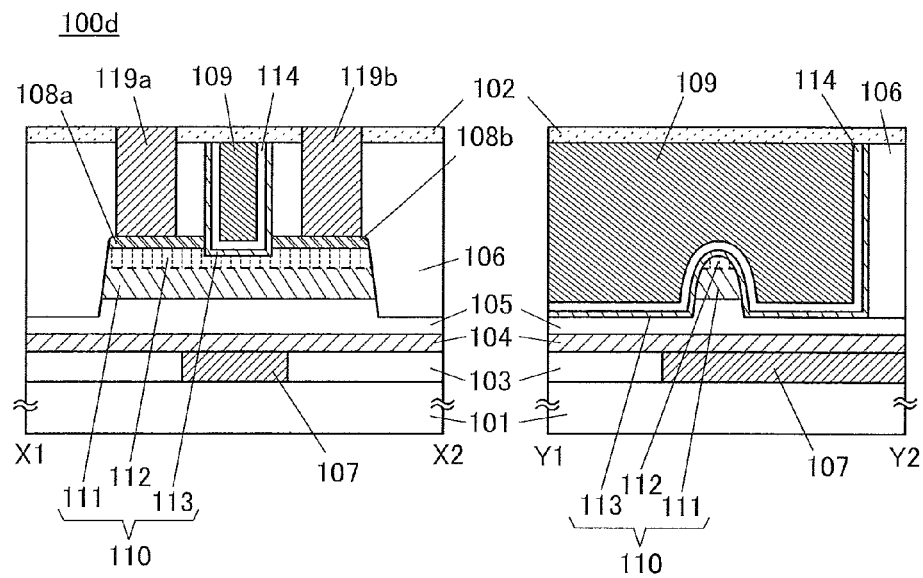
FIGS. 11A and 11B show cross-sectional views and a top view, respectively, illustrating one embodiment of a transistor.
Figure 11B:
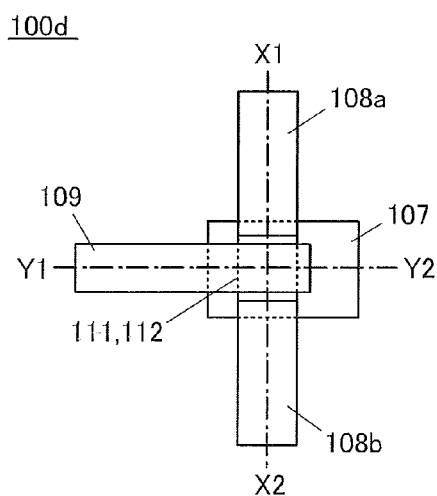

FIGS. 11A and 11B show cross-sectional views and a top view of a transistor 100d. FIG. 11B is a top view. A cross section taken along the dashed-dotted line X1-X2 in FIG. 11B is illustrated on the left side of FIG. 11A, and a cross section taken along the dashed-dotted line Y1-Y2 in FIG. 11B is illustrated on the right side of FIG. 11A. Note that for simplification of the drawings, some components are increased or reduced in size, or omitted in FIGS. 11A and 11B. The direction of the dashed-dotted line X1-X2 may be called a channel length direction, and the direction of the dashed-dotted line Y1-Y2 may be called a channel width direction.

The transistor 100d is different from the transistor 100a in that a groove is provided in the insulator 106 and the semiconductor 113, the insulator 114, and the conductor 109 are positioned in the groove. The transistor 100d is preferable in that the parasitic capacitance generated between the conductor 109 and the conductor 108a (or between the conductor 109 and the conductor 108b) can be lower than that in the transistor 100a.

The description of the transistor 100a can be referred to for the other components of the transistor 100d.

<<Structure Example 4 of Transistor>>

Figure 12A:
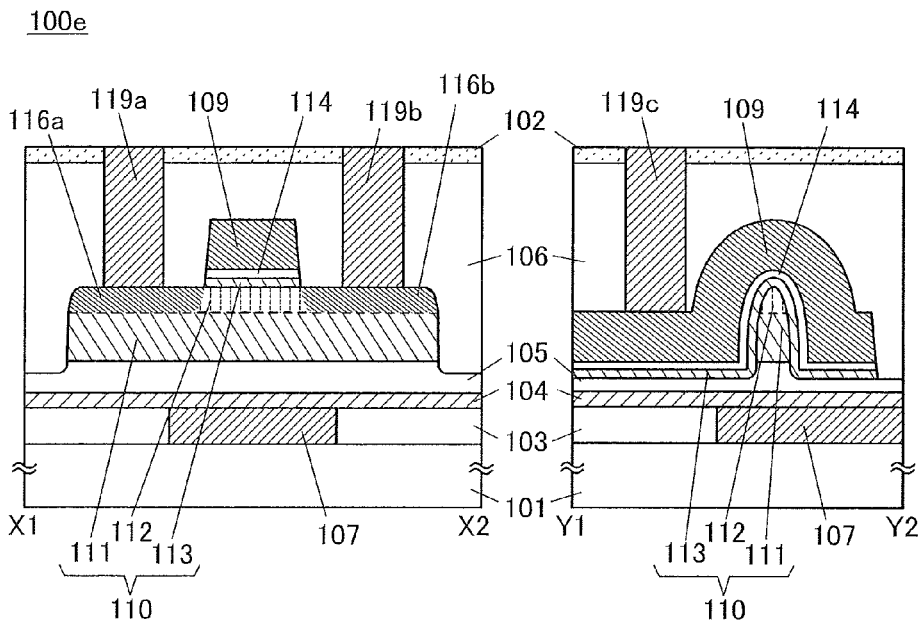
FIGS. 12A and 12B show cross-sectional views and a top view, respectively, illustrating one embodiment of a transistor.
Figure 12B:
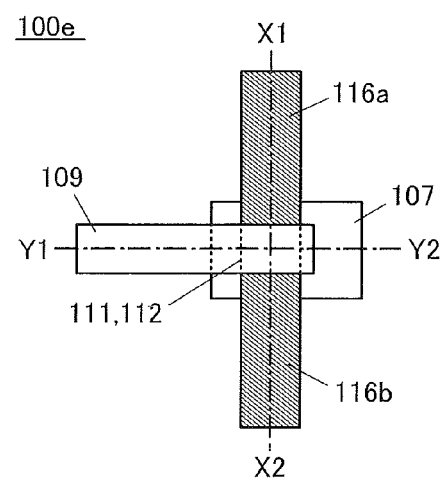

FIGS. 12A and 12B show cross-sectional views and a top view of a transistor 100e. FIG. 12B is a top view. A cross section taken along the dashed-dotted line X1-X2 in FIG. 12B is illustrated on the left side of FIG. 12A, and a cross section taken along the dashed-dotted line Y1-Y2 in FIG. 12B is illustrated on the right side of FIG. 12A. Note that for simplification of the drawings, some components are increased or reduced in size, or omitted in FIGS. 12A and 12B. The direction of the dashed-dotted line X1-X2 may be called a channel length direction, and the direction of the dashed-dotted line Y1-Y2 may be called a channel width direction.

The transistor 100e includes a region 116a and a region 116b, which are low-resistance regions, in the semiconductor 112. The region 116a and the region 116b serve as a source region and a drain region. The regions 116a and 116b are preferably formed in a self-aligned manner after the conductor 109 is formed.

To the regions 116a and 116b, a rare gas such as argon is preferably added in order to form an oxygen vacancy. In that case, the concentration of a rare gas element in the regions 116a and 116b is preferably higher than that in the semiconductor 112 overlapping with the conductor 109.

Furthermore, to the regions 116a and 116b, hydrogen is also preferably added. In that case, the concentration of hydrogen in the regions 116a and 116b is preferably higher than that in the semiconductor 112 overlapping with the conductor 109.

To the regions 116a and 116b, an impurity such as boron, carbon, nitrogen, fluorine, aluminum, silicon, phosphorus, or chlorine may also be added. In that case, the concentration of the impurity in the regions 116a and 116b is preferably higher than that in the semiconductor 112 overlapping with the conductor 109.

When the regions 116a and 116b have a high hydrogen concentration and a large amount of oxygen vacancies, the regions 116a and 116b have high conductivity and serve as low-resistance regions.

The description of the transistor 100*a* can be referred to for the other components of the transistor 100*e*.

<<Structure Example 5 of Transistor>>

Figure 13A:
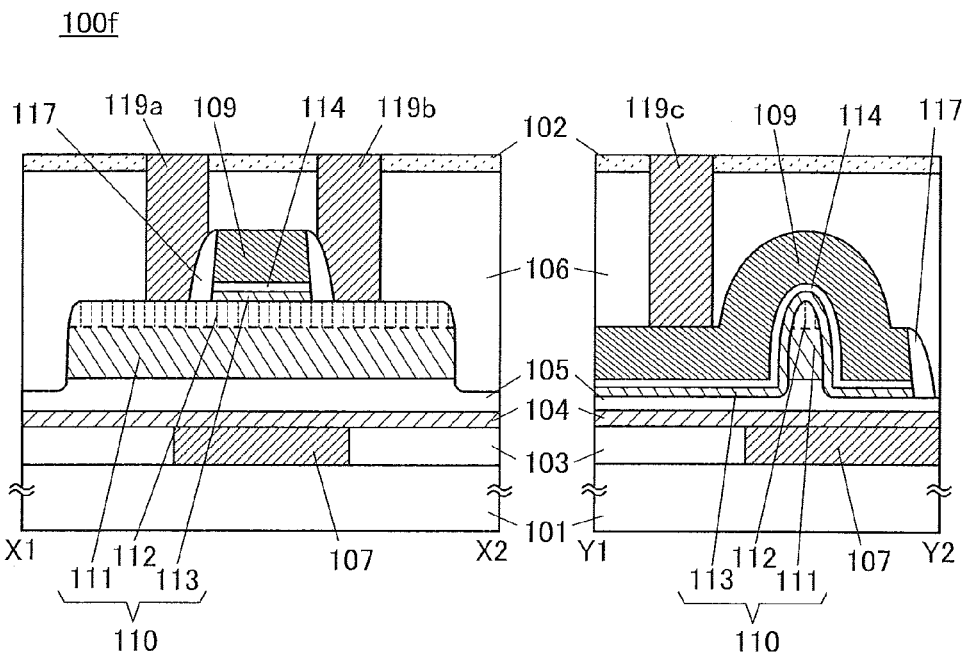
FIGS. 13A and 13B show cross-sectional views and a top view, respectively, illustrating one embodiment of a transistor.
Figure 13B:
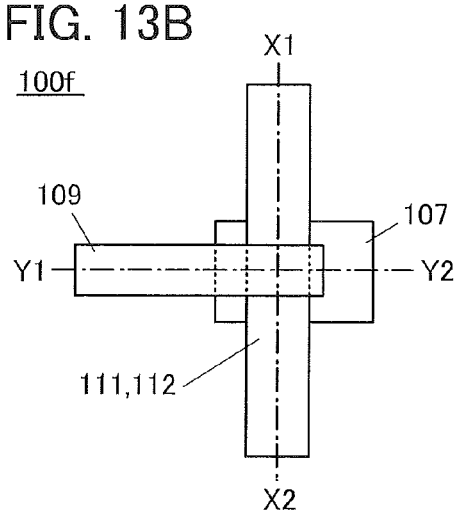

FIGS. 13A and 13B show cross-sectional views and a top view of a transistor 100*f*. FIG. 13B is a top view. A cross section taken along the dashed-dotted line X1-X2 in FIG. 13B is illustrated on the left side of FIG. 13A, and a cross section taken along the dashed-dotted line Y1-Y2 in FIG. 13B is illustrated on the right side of FIG. 13A. Note that for simplification of the drawings, some components are increased or reduced in size, or omitted in FIGS. 13A and 13B. The direction of the dashed-dotted line X1-X2 may be called a channel length direction, and the direction of the dashed-dotted line Y1-Y2 may be called a channel width direction.

In the transistor 100*f*, a sidewall insulating layer 117 is provided on a sidewall of the conductor 109. The plugs 119*a* and 119*b* are formed in contact with the sidewall insulating layer 117. The sidewall insulating layer 117 prevents the contact between the plug 119*a* and the conductor 109 (or between the plug 119*b* and the conductor 109).

The resistance of the semiconductor 112 overlapping with the sidewall insulating layer 117 may be low. In that case, the semiconductor 112 overlapping with the sidewall insulating layer 117 preferably contains a larger amount of hydrogen or a rare gas than the semiconductor 112 overlapping with the conductor 109.

<<Structure Example 6 of Transistor>>

Figure 14A:
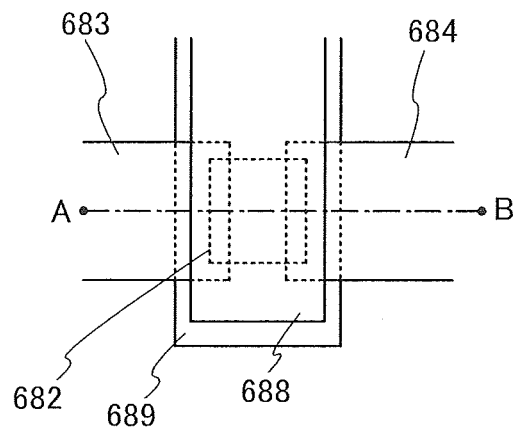
FIGS. 14A and 14B are a top view and a cross-sectional view, respectively, illustrating one embodiment of a transistor.
Figure 14B:
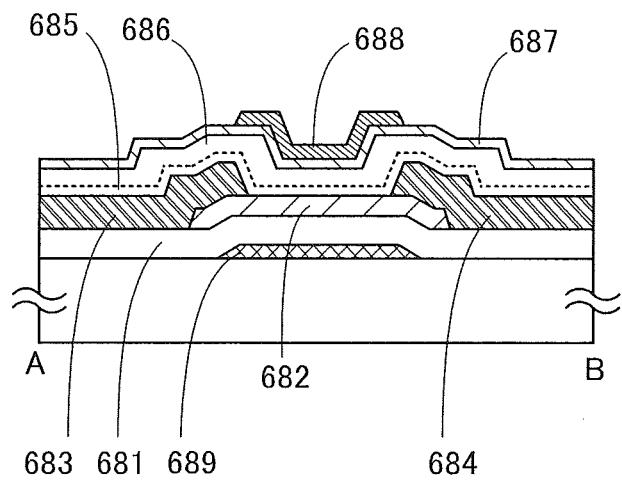

FIGS. 14A and 14B are a top view and a cross-sectional view of a transistor 680. FIG. 14A is a top view. A cross section taken along the dashed-dotted line A-B in FIG. 14A is illustrated in FIG. 14B. Note that for simplification of the drawings, some components are increased or reduced in size, or omitted in FIGS. 14A and 14B. The direction of the dashed-dotted line A-B may be called a channel length direction.

The transistor 680 shown in FIG. 14B includes a conductor 689 serving as a first gate, a conductor 688 serving as a second gate, a semiconductor 682, a conductor 683 and a conductor 684 serving as a source and a drain, an insulator 681, an insulator 685, an insulator 686, and an insulator 687.

The conductor 689 is on an insulating surface. The conductor 689 overlaps with the semiconductor 682 with the insulator 681 provided therebetween. The conductor 688 overlaps with the semiconductor 682 with the insulators 685, 686, and 687 provided therebetween. The conductors 683 and 684 are connected to the semiconductor 682.

The description of the conductors 109 and 107 in FIGS. 8A and 8B can be referred to for the details of the conductors 689 and 688.

The description of the semiconductor 112 in FIG. 8A can be referred to for the details of the semiconductor 682. The semiconductor 682 may be a single layer or a stack including a plurality of semiconductor layers.

The description of the conductors 108*a* and 108*b* in FIGS. 8A and 8B can be referred to for the details of the conductors 683 and 684.

The description of the insulator 114 in FIG. 8A can be referred to for the details of the insulator 681.

The insulators 685 to 687 are sequentially stacked over the semiconductor 682 and the conductors 683 and 684 in FIG. 14B; however, an insulator provided over the semiconductor 682 and the conductors 683 and 684 may be a single layer or a stack including a plurality of insulators.

In the case of using an oxide semiconductor as the semiconductor 682, the insulator 686 preferably contains oxygen at a proportion higher than or equal to that in the stoichiometric composition and has a function of supplying part of oxygen to the semiconductor 682 by heating. Note that in the case where providing the insulator 686 directly on the semiconductor 682 causes damage to the semiconductor 682 at the time of formation of the insulator 686, the insulator 685 is preferably provided between the semiconductor 682 and the insulator 686, as illustrated in FIG. 14B. The insulator 685 preferably allows oxygen to pass therethrough, and causes little damage to the semiconductor 682 when the insulator 685 is formed compared with the case of the insulator 686. If damage to the semiconductor 682 can be reduced and the insulator 686 can be formed directly on the semiconductor 682, the insulator 685 is not necessarily provided.

For the insulators 686 and 685, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulator 687 preferably has an effect of blocking diffusion of oxygen, hydrogen, and water. Alternatively, the insulator 687 preferably has an effect of blocking diffusion of hydrogen and water. The insulator 687 can be formed using, for example, aluminum oxide, aluminum oxynitride, gallium oxide, gallium oxynitride, yttrium oxide, yttrium oxynitride, hafnium oxide, or hafnium oxynitride. An insulator that has an effect of blocking diffusion of hydrogen and water can be formed using, for example, silicon nitride or silicon nitride oxide.

<<Structure Example 1 of Semiconductor Device>>

Figure 15:
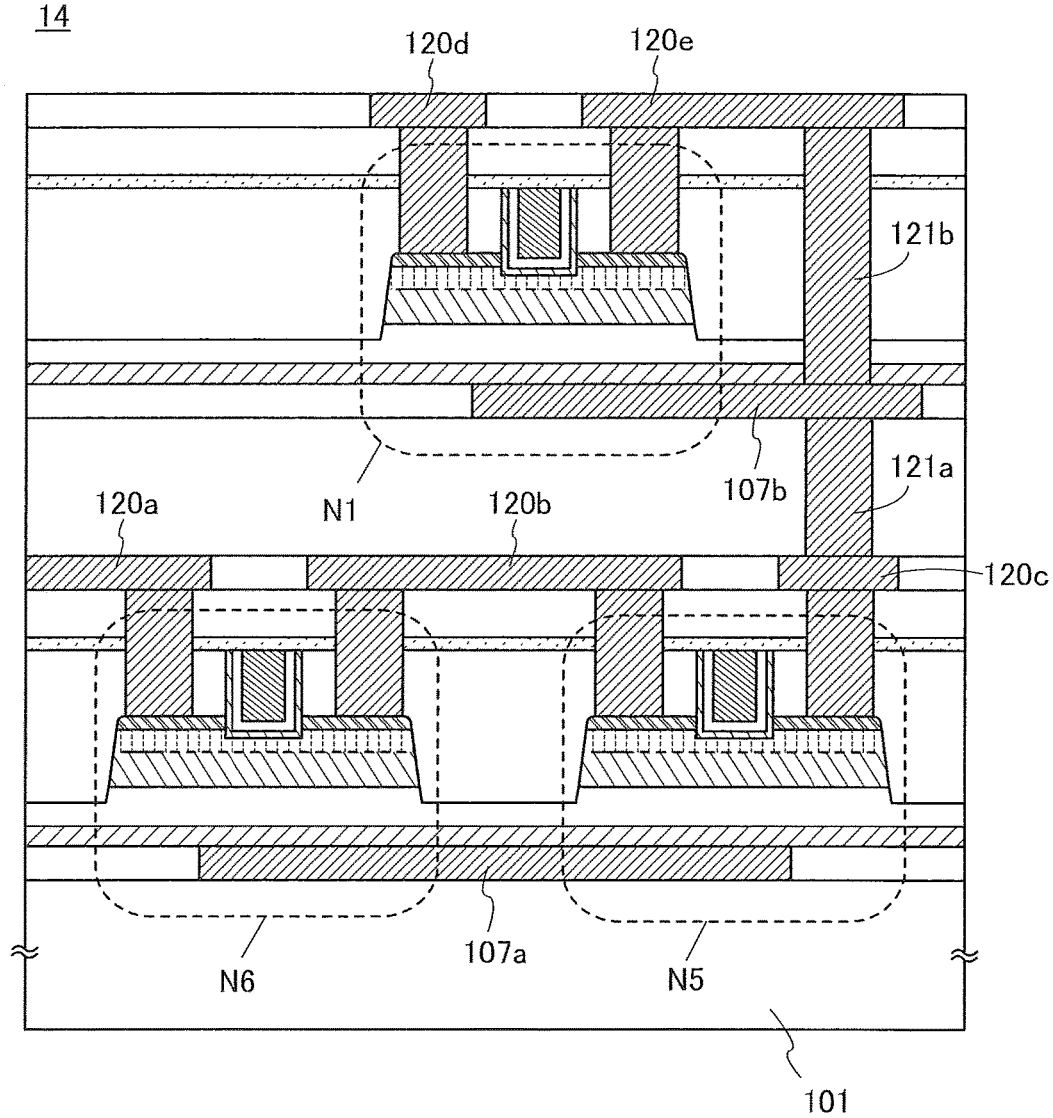
FIG. 15 is a cross-sectional view illustrating one embodiment of a semiconductor device.

A cross-sectional view in FIG. 15 shows a structure example of the semiconductor device 14 illustrated in FIG. 6A. In the semiconductor device 14 in FIG. 15, the transistors N5 and N6 are provided over the substrate 101, and the transistor N1 is provided over the transistors N5 and N6. In the example of FIG. 15, the transistor 100*d* in FIGS. 11A and 11B is used as each of the transistors N1, N5, and N6.

The semiconductor device 14 includes, in addition to the transistors N1, N5, and N6, wirings 120*a* to 120*e*, plugs 121*a* and 121*b*, and the like. Note that the wirings and the plugs illustrated in FIG. 15 may be formed by a dual damascene method.

A conductor 107*a* in FIG. 15 serves as second gates of the transistors N5 and N6. In this manner, one conductor may serve as second gates of a plurality of transistors. A conductor 107*b* serves as a second gate of the transistor N1.

The OS transistors are stacked as shown in FIG. 15, whereby the integration degree of the semiconductor device 14 can be improved and the area occupied by the semiconductor device 14 can be small.

Note that the transistors N1, N6, and N5 are not necessarily stacked, and may be formed in one layer. In that case, the manufacturing process of the semiconductor device 14 can be facilitated.

<<Structure Example 2 of Semiconductor Device>>

The semiconductor device described in Embodiment 1 may be formed using a stack of a Si transistor and an OS transistor. A structure example in that case is illustrated in FIG. 16.

Figure 16:
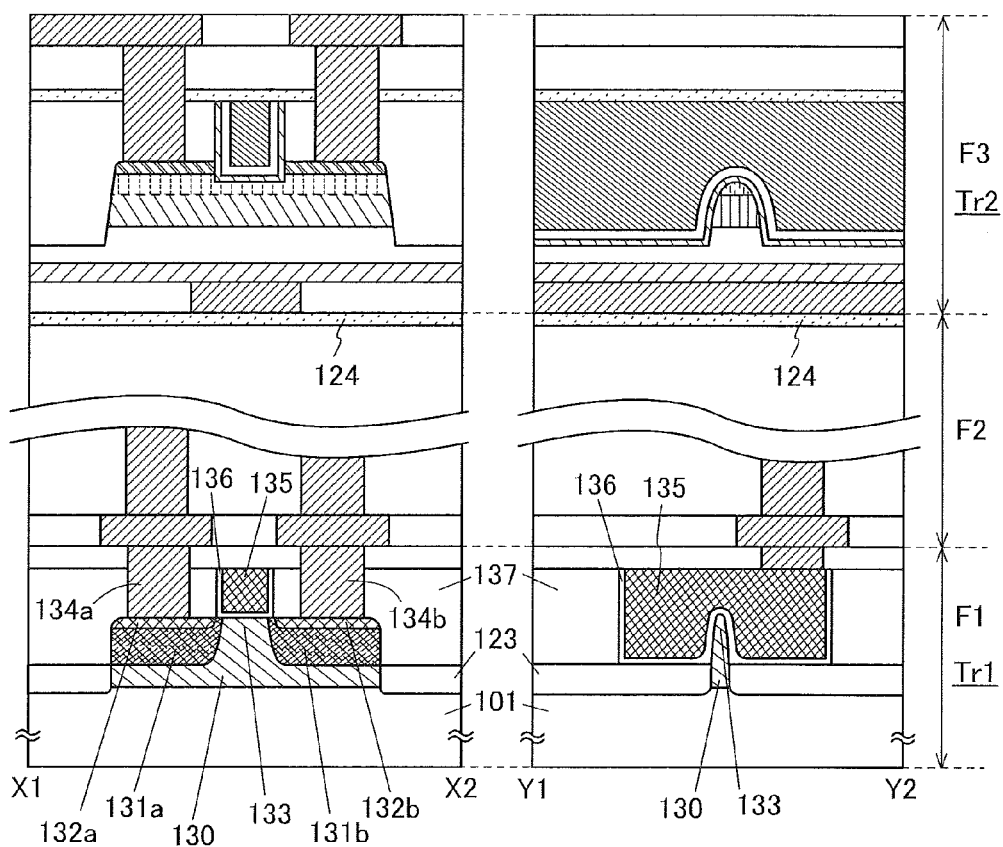
FIG. 16 shows cross-sectional views illustrating one embodiment of a semiconductor device.

A cross-sectional view of a semiconductor device in the channel length direction of a transistor is illustrated on the left side of FIG. 16, and a cross-sectional view of the semiconductor device in the channel width direction of the transistor is illustrated on the right side of FIG. 16.

In the semiconductor device of FIG. 16, a layer F1, a layer F2, and a layer F3 are sequentially provided from the bottom.

The layer F1 includes a transistor Tr1 formed on the substrate 101, an insulator 137, and the like.

The layer F2 includes an insulator 124, wirings, plugs, and the like.

The layer F3 includes a transistor Tr2 and the like. In the example of FIG. 16, the transistor 100d illustrated in FIGS. 11A and 11B is used as the transistor Tr2.

The transistor Tr1 is provided over the substrate 101, and is separated from an adjacent transistor by an element isolation layer 123. For the element isolation layer 123, silicon oxide, silicon oxynitride, silicon nitride oxide, silicon nitride, or the like can be used. In the example illustrated in FIG. 16, a single crystal silicon wafer is used as the substrate 101.

The transistor Tr1 includes a channel formation region 133 and impurity regions 131a and 131b provided in a well 130; conductive regions 132a and 132b provided in contact with the impurity regions 131a and 131b; a gate insulator 136 provided over the channel formation region 133; a gate electrode 135 provided over the gate insulator 136; a plug 134a provided in contact with the conductive region 132a; and a plug 134b provided in contact with the conductive region 132b. For the conductive regions 132a and 132b, metal silicide or the like may be used.

In the transistor Tr1 in FIG. 16, the channel formation region 133 has a projecting portion, and the gate insulator 136 and the gate electrode 135 are provided along side and top surfaces of the channel formation region 133. The transistor with such a shape is referred to as a FIN-type transistor. Although the projecting portion is formed by processing part of the semiconductor substrate in this embodiment, a semiconductor layer with a projecting portion may be formed by processing an SOI substrate.

The transistor Tr1 may be either an n-channel transistor or a p-channel transistor; an appropriate transistor is used depending on a circuit.

The insulator 137 serves as an interlayer insulator. In the case where a Si transistor is used as the transistor Tr1, the insulator 137 preferably contains hydrogen. When the insulator 137 contains hydrogen, dangling bonds of silicon can be terminated and thus the reliability of the transistor Tr1 can be improved. For the insulator 137, silicon oxide, silicon oxynitride, silicon nitride oxide, silicon nitride, or the like is preferably used.

Like the insulator 102 in FIG. 8A, the insulator 124 preferably has a function of blocking oxygen, hydrogen, water, alkali metal, alkaline earth metal, and the like. Providing the insulator 124 can prevent outward diffusion of oxygen contained in the transistor Tr2 to the outside and entry of hydrogen, water, or the like into the transistor Tr2 from the transistor Tr1.

The insulator 124 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride. An aluminum oxide film is particularly preferable because it is highly effective in preventing permeation of both oxygen and impurities such as hydrogen and moisture.

In FIGS. 8A and 8B, FIGS. 9A and 9B, FIGS. 10A and 10B, FIGS. 11A and 11B, FIGS. 12A and 12B, FIGS. 13A and 14B, FIGS. 14A and 14B, FIG. 15, and FIG. 16, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used.

For example, in the semiconductor device 10a illustrated in FIG. 1A, an OS transistor may be used as the transistor N1 and Si transistors may be used as the transistors N2 and N3. Since the on-state current of a Si transistor is large, the semiconductor device 10a can operate at high speed.

Alternatively, the semiconductor device described in Embodiment 1 may be formed using an OS transistor and its peripheral circuit may be formed using a Si transistor. In that case, an OS transistor and a Si transistor are stacked as illustrated in FIG. 16, whereby the area occupied by the whole semiconductor device can be small.

Embodiment 3

In this embodiment, a CPU in which the semiconductor device described in Embodiment 1 can be used will be described.

Figure 17:
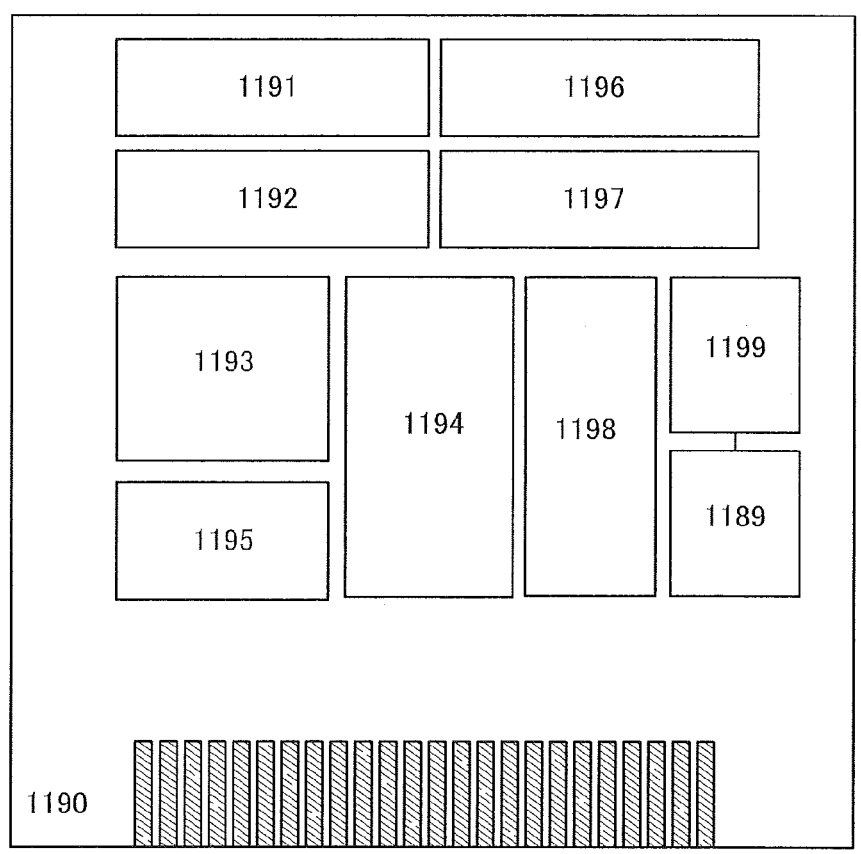
FIG. 17 is a block diagram illustrating one embodiment of a CPU.

FIG. 17 is a block diagram showing a configuration example of a CPU.

The CPU shown in FIG. 17 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 17 is just an example with a simplified configuration, and an actual CPU may have a variety of configurations depending on the application. For example, a CPU may include a plurality of cores each of which includes the CPU shown in FIG. 17 or an arithmetic circuit and which operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register

1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

The logic circuits in the CPU illustrated in FIG. 17 can be formed using the semiconductor device described in Embodiment 1. With the use of the semiconductor device described in Embodiment 1, the number of transistors in the circuits can be smaller and the power consumption of the CPU can be reduced.

Embodiment 4

In this embodiment, a programmable logic device (PLD) that can be formed using the semiconductor device described in Embodiment 1 will be described.

A PLD has a structure in which adequate-scale logic circuits (logic blocks, or programmable logic elements) are electrically connected to each other by a routing resource, and the functions of the logic blocks and the connection between the logic blocks can be changed after manufacture. The functions of the logic blocks and the connection between the logic blocks formed using a routing resource are determined by configuration data, and the configuration data is stored in a register included in each logic block or a register included in the routing resource. A register for storing configuration data is hereinafter referred to as a configuration memory.

Figure 18A:
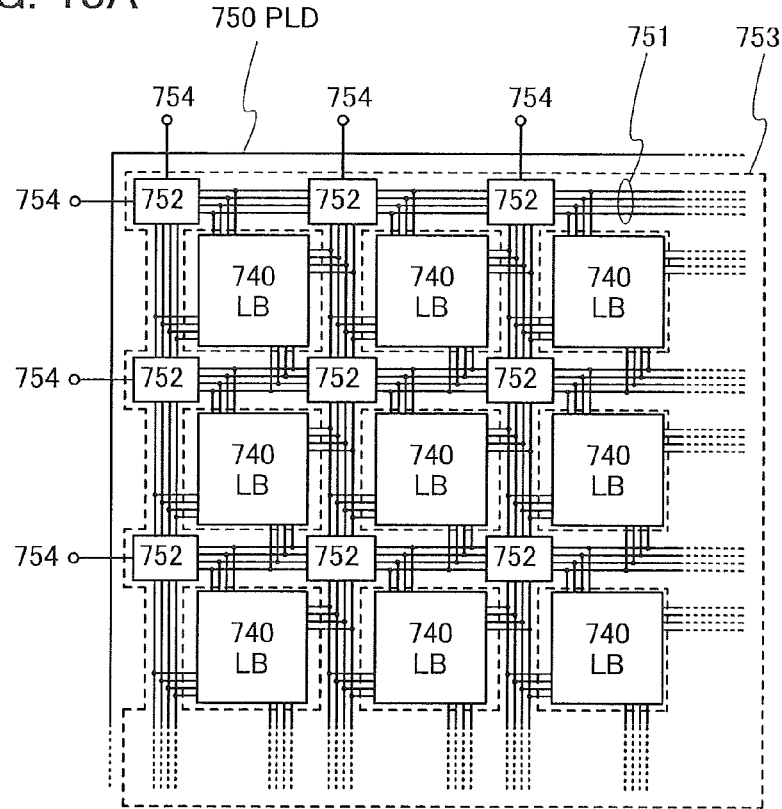
FIGS. 18A and 18B are a block diagram and a circuit diagram illustrating one embodiment of a PLD.

FIG. 18A schematically illustrates part of the structure of a PLD 750. The PLD 750 in FIG. 18A includes a plurality of logic blocks (LB) 740, a wiring group 751 connected to any of the plurality of logic blocks 740, and switch circuits 752 for controlling the connection between the wirings of the wiring group 751. The wiring group 751 and the switch circuits 752 constitute a routing resource 753.

Figure 18B:
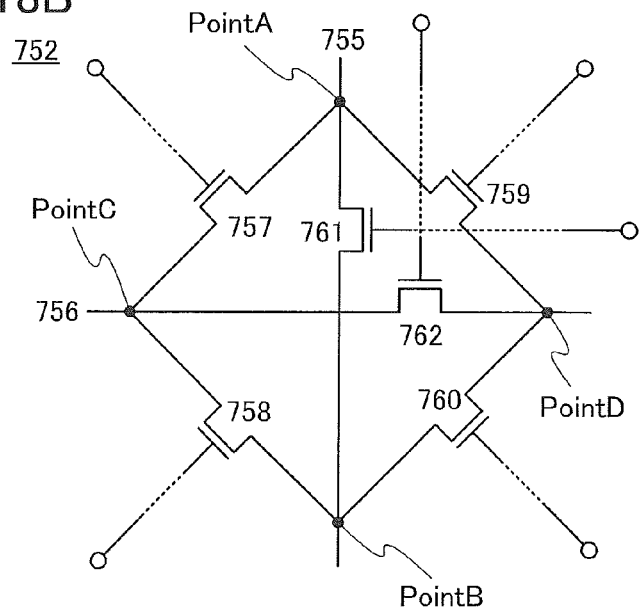

FIG. 18B illustrates a structure example of the switch circuit 752. The switch circuit 752 in FIG. 18B has a function of controlling connection between a wiring 755 and a wiring 756 included in the wiring group 751. Specifically, the switch circuit 752 includes transistors 757 to 762.

The transistor 757 has a function of controlling electrical connection between a point A of the wiring 755 and a point C of the wiring 756. The transistor 758 has a function of controlling electrical connection between a point B of the wiring 755 and the point C of the wiring 756. The transistor 759 has a function of controlling electrical connection between the point A of the wiring 755 and a point D of the wiring 756. The transistor 760 has a function of controlling electrical connection between the point B of the wiring 755 and the point D of the wiring 756. The transistor 761 has a function of controlling electrical connection between the point A and the point B of the wiring 755. The transistor 762 has a function of controlling electrical connection between the point C and the point D of the wiring 756.

The switch circuits 752 also have a function of controlling electrical connection between the wiring group 751 and terminals 754 of the PLD 750.

Figure 19A:
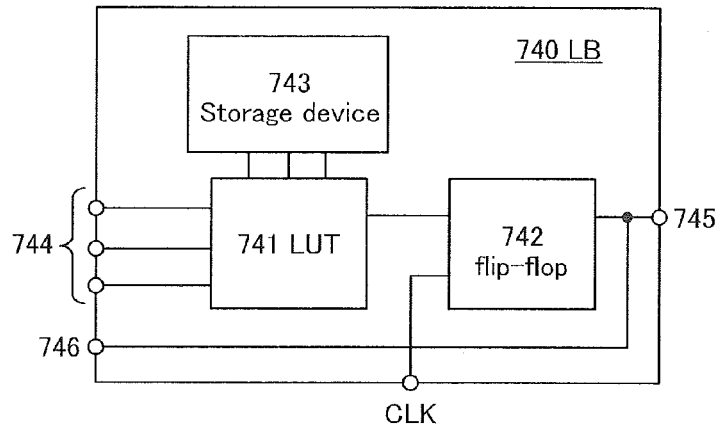
FIGS. 19A to 19C are block diagrams each illustrating one embodiment of a logic block.

FIG. 19A illustrates one mode of the logic block 740. The logic block 740 illustrated in FIG. 19A includes a look-up table (LUT) 741, a flip-flop 742, and a storage device 743. Logical operation of the LUT 741 is determined in accordance with configuration data in the storage device 743. Specifically, one output value of the LUT 741 with respect to input values of a plurality of input signals supplied to input terminals 744 is determined. Then, the LUT 741 outputs a signal including the output value. The flip-flop 742 holds the signal output from the LUT 741 and outputs an output signal corresponding to the signal from a first output terminal 745 and a second output terminal 746 in synchronization with a clock signal CLK.

Note that the logic block 740 may further include a multiplexer circuit. The multiplexer circuit can select whether the output signal from the LUT 741 goes through the flip-flop 742.

The type of the flip-flop 742 may be determined by configuration data. Specifically, the flip-flop 742 may have a function of any of a D flip-flop, a T flip-flop, a JK flip-flop, and an RS flip-flop, depending on the configuration data.

Figure 19B:
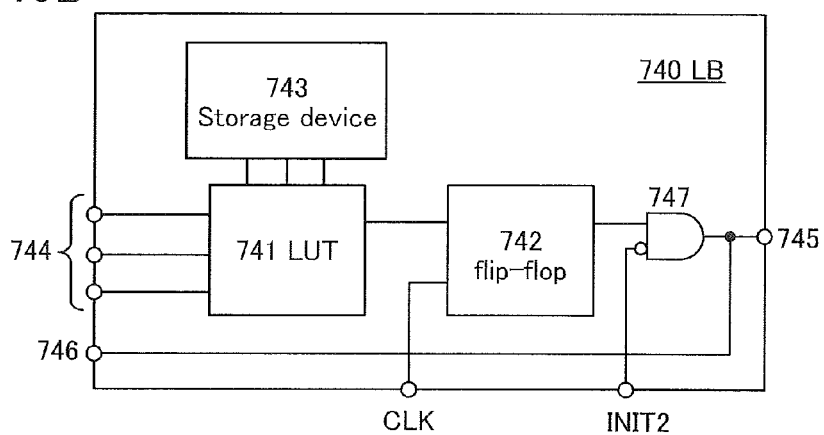

FIG. 19B illustrates another mode of the logic block 740. The logic block 740 in FIG. 19B has a structure in which an AND circuit 747 is added to the logic block 740 in FIG. 19A. To the AND circuit 747, a signal from the flip-flop 742 is supplied as a positive logic input, and a signal INIT2 is supplied as a negative logic input. With such a structure, the potential of a wiring to which a signal output from the logic block 740 is supplied can be initialized. Consequently, flow of a large amount of current between the logic blocks 740 can be prevented, so that breakage of the PLD can be prevented.

Figure 19C:
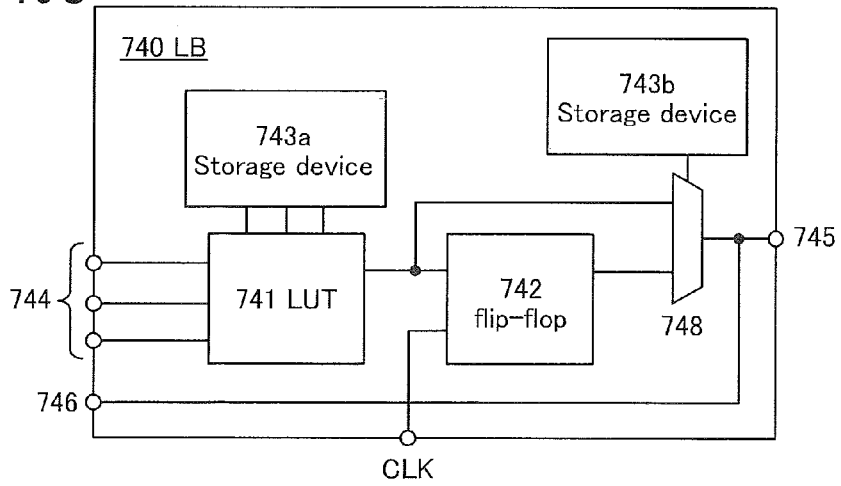

FIG. 19C illustrates another mode of the logic block 740. The logic block 740 in FIG. 19C has a structure in which a multiplexer 748 is added to the logic block 740 in FIG. 19A. The logic block 740 in FIG. 19C includes two storage devices 743 (storage devices 743a and 743b). Logical operation of the LUT 741 is determined in accordance with configuration data in the storage device 743a. A signal output from the LUT 741 and a signal output from the flip-flop 742 are input to the multiplexer 748. The multiplexer 748 has functions of selecting and outputting one of the two output signals in accordance with configuration data stored in the storage device 743b. The signal output from the multiplexer 748 is output from the first output terminal 745 and the second output terminal 746.

Figure 20:
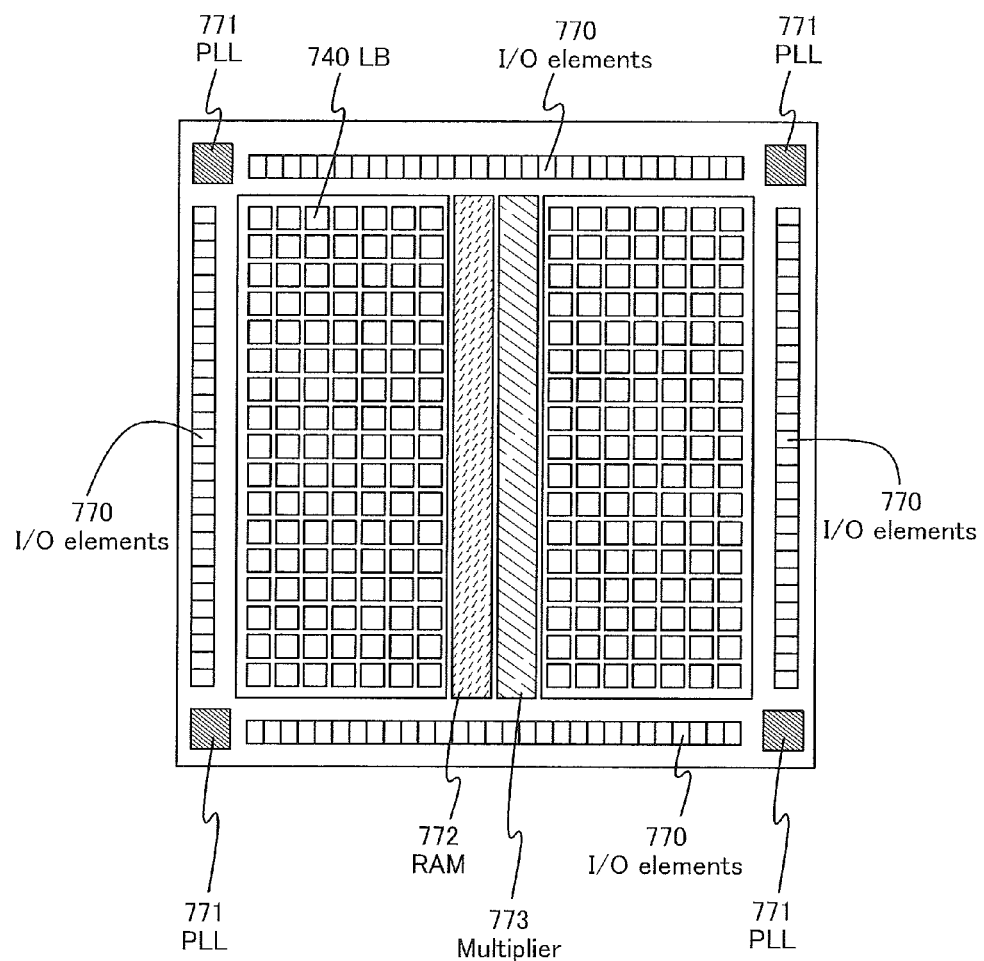
FIG. 20 is a block diagram illustrating one embodiment of a PLD.

FIG. 20 illustrates an example of the entire structure of the PLD 750. In FIG. 20, I/O elements 770, phase lock loops (PLL) 771, a RAM 772, and a multiplier 773 are provided in the PLD 750. The I/O elements 770 function as interfaces that control input and output of signals from and to an external circuit of the PLD 750. The PLL 771 has a function of generating a clock signal CLK. The RAM 772 has a function of storing data used for logic operation. The multiplier 773 is a logic circuit dedicated to multiplication. When the PLD 750 has a function of executing multiplication, the multiplier 773 is not necessarily provided.

The logic circuits in the logic block 740 can be formed using the semiconductor device described in Embodiment 1. With the use of the semiconductor device described in Embodiment 1, the number of transistors in the logic block 740 can be smaller and the power consumption of the PLD 750 can be reduced.

Embodiment 5

The semiconductor device of one embodiment of the present invention can be used for vehicles such as an automobile, a motorcycle, and a bicycle, aircrafts, ships, and the like. The semiconductor device of one embodiment of the present invention can also be used for electronic devices such as a cellular phone, a wristwatch, a portable game machine, a portable data terminal, an e-book reader, a video camera, a digital still camera, and a goggle-type display (head-mounted display). Specific examples of them are illustrated in FIGS. 21A to 21F.

Figure 21A:
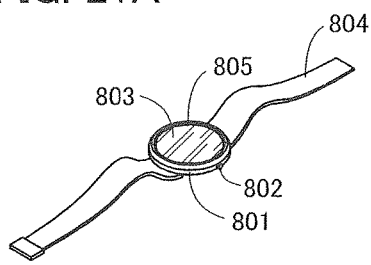
FIGS. 21A to 21F each illustrate an electronic device.

FIG. 21A illustrates a wristwatch-type terminal, which includes a housing 801, a winder 802, a display portion 803, a belt 804, a sensor portion 805, and the like. The display portion 803 may include a touch panel. A user can input data by using finger touching the touch panel as a pointer.

The sensor portion 805 is configured to acquire data by determining the surrounding state. For example, a camera, an acceleration sensor, a direction sensor, a pressure sensor, a temperature sensor, a humidity sensor, an illuminance sensor, or a global positioning system (GPS) signal receiving circuit can be used as the sensor portion 805.

For example, when an arithmetic device in the housing 801 determines that the ambient light level measured by an illuminance sensor of the sensor portion 805 is sufficiently higher than the predetermined illuminance, a reflective liquid crystal element is used as a display element of the display portion 803. In the case where the arithmetic device determines that the ambient light level is not sufficiently high, an organic EL element is used as a display element of the display portion 803. Thus, image data can be displayed in such a manner that, for example, a reflective display element is used in an environment with strong external light and a self-luminous display element is used in a dim environment. As a result, the power consumption of the electronic device can be reduced.

Figure 21B:
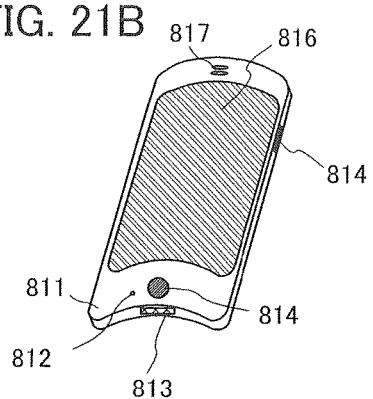

FIG. 21B illustrates a cellular phone, which includes a housing 811, a display portion 816, operation buttons 814, an external connection port 813, a speaker 817, a microphone 812, and the like. When the display portion 816 of the cellular phone illustrated in FIG. 21B is touched with a finger or the like, data can be input. Further, operations such as making a call and inputting a character can be performed by touch on the display portion 816 with a finger or the like. The power can be turned on or off with the operation button 814. In addition, types of images displayed on the display portion 816 can be switched; for example, switching images from a mail creation screen to a main menu screen is performed with the operation button 814.

Figure 21C:
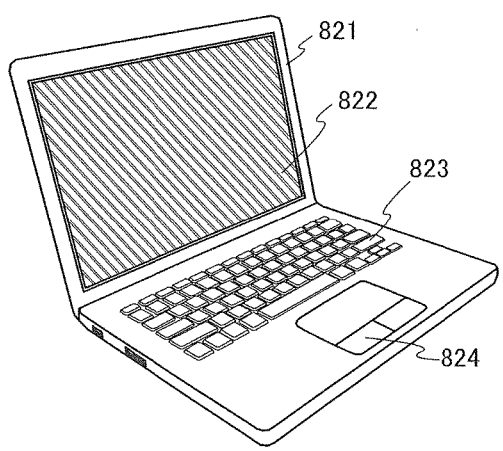

FIG. 21C illustrates a laptop personal computer, which includes a housing 821, a display portion 822, a keyboard 823, a pointing device 824, and the like.

Figure 21D:
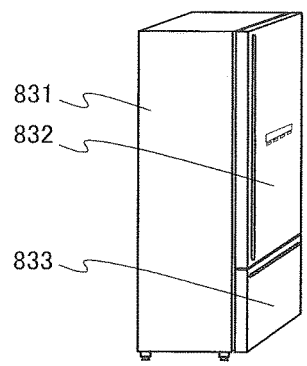

FIG. 21D illustrates an electric refrigerator-freezer, which includes a housing 831, a refrigerator door 832, a freezer door 833, and the like.

Figure 21E:
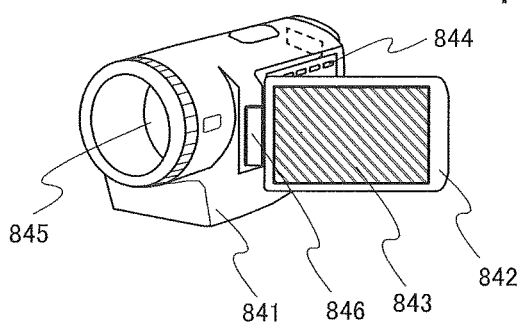

FIG. 21E illustrates a video camera, which includes a first housing 841, a second housing 842, a display portion 843, operation keys 844, a lens 845, a joint 846, and the like. The operation keys 844 and the lens 845 are provided for the first housing 841, and the display portion 843 is provided for the second housing 842. The first housing 841 and the second housing 842 are connected to each other with the joint 846, and the angle between the first housing 841 and the second housing 842 can be changed with the joint 846. Images displayed on the display portion 843 may be switched in accordance with the angle at the joint 846 between the first housing 841 and the second housing 842.

Figure 21F:
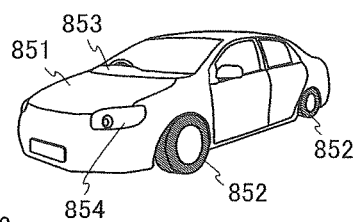

FIG. 21F illustrates a car, which includes a car body 851, wheels 852, a dashboard 853, lights 854, and the like.

Embodiment 6

In this embodiment, a display device in which the semiconductor device described in Embodiment 1 can be used will be described.

The display device includes at least one of, for example, an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), an electron emitter, a display element including a carbon nanotube, a liquid crystal element, electronic ink, Electronic Liquid Powder (registered trademark), an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), a quantum dot, and the like.

In this embodiment, display devices including a liquid crystal element and a display device including an EL element will be described as examples of the display device with reference to FIGS. 22A to 22C and FIGS. 23A and 23B.

Figure 22A:
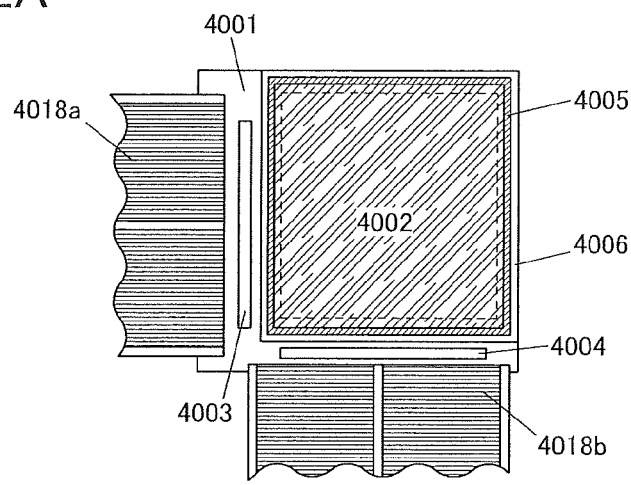
FIGS. 22A to 22C are top views each illustrating an example of a display device.
Figure 22B:
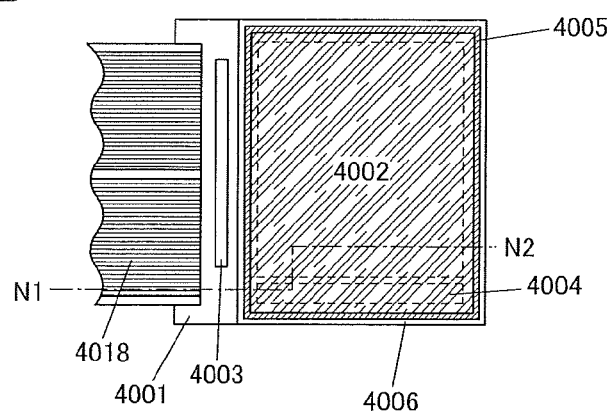
Figure 22C:
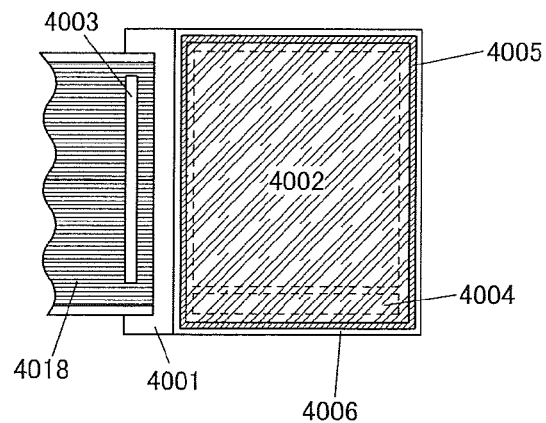

FIGS. 22A to 22C are top views each illustrating a structure example of a display device. In FIG. 22A, a sealant 4005 is provided so as to surround a pixel portion 4002 provided over a first substrate 4001, and the pixel portion 4002 is sealed with a second substrate 4006. In FIG. 22A, a signal line driver circuit 4003 and a scan line driver circuit 4004 are provided in a region different from the region surrounded by the sealant 4005 over the first substrate 4001. Various signals and potentials are supplied to the signal line driver circuit 4003, the scan line driver circuit 4004, and the pixel portion 4002 through flexible printed circuits (FPCs) 4018a and 4018b.

In FIGS. 22B and 22C, the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Hence, the pixel portion 4002 and the scan line driver circuit 4004 are sealed together with the display element, by the first substrate 4001, the sealant 4005, and the second substrate 4006. Furthermore, in FIGS. 22B and 22C, the signal line driver circuit 4003 is provided in a region that is different from the region surrounded by the sealant 4005 over the first substrate 4001. In FIGS. 22B and 22C, various signals and potentials are supplied to the signal line driver circuit 4003, the scan line driver circuit 4004, and the pixel portion 4002 through an FPC 4018.

Although FIGS. 22B and 22C each illustrate an example in which the signal line driver circuit 4003 is formed separately and provided over the first substrate 4001, an embodiment of the present invention is not limited to this structure. The scan line driver circuit may be separately formed and then provided, or only part of the signal line driver circuit or only part of the scan line driver circuit may be separately formed and then provided.

The connection method of a separately formed driver circuit is not particularly limited; wire bonding, a chip on glass (COG), a tape carrier package (TCP), a chip on film (COF), or the like can be used. FIG. 22A illustrates an example in which the signal line driver circuit 4003 and the scan line driver circuit 4004 are provided by a COG. FIG. 22B illustrates an example in which the signal line driver circuit 4003 is provided by a COG. FIG. 22C illustrates an example in which the signal line driver circuit 4003 is provided by a TCP.

For the signal line driver circuit 4003 or the scan line driver circuit 4004, the semiconductor device described in Embodiment 1 can be used. With the use of the semiconductor device described in Embodiment 1, the number of transistors in the signal line driver circuit 4003 or the scan line driver circuit 4004 can be smaller and the power consumption of the display device can be reduced.

FIGS. 23A and 23B correspond to cross-sectional views taken along chain line N1-N2 in FIG. 22B. As shown in FIGS. 23A and 23B, the display device has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110.

The electrode 4015 is formed using the same conductive layer as a first electrode layer 4030, and the wiring 4014 is formed using the same conductive layer as source and drain electrodes of transistors 4010 and 4011.

The pixel portion 4002 and the scan line driver circuit 4004 provided over the first substrate 4001 include a plurality of transistors. In FIGS. 23A and 23B, the transistor 4010 included in the pixel portion 4002 and the transistor 4011 included in the scan line driver circuit 4004 are shown as an example. The insulating layers 4112, 4111, and 4110 are provided over the transistors 4010 and 4011 in FIG. 23A, and a bank 4510 is further provided over the insulating layer 4112 in FIG. 23B.

The transistors 4010 and 4011 are provided over an insulating layer 4102. The transistors 4010 and 4011 each include an electrode 4017 over the insulating layer 4102. An insulating layer 4103 is formed over the electrode 4017. The electrode 4017 can serve as a back gate electrode.

The transistor described in Embodiment 2 can be applied to the transistors 4010 and 4011.

FIGS. 23A and 23B illustrate the case where a transistor having a structure similar to that of the transistor 680 illustrated in FIGS. 14A and 14B is used as each of the transistors 4010 and 4011. Note that a transistor that can be used as each of the transistors 4010 and 4011 is not limited thereto. For example, a single crystal silicon transistor, a polycrystalline silicon transistor, an amorphous silicon transistor, an organic semiconductor transistor, or the like may be used as each of the transistors 4010 and 4011.

The display devices illustrated in FIGS. 23A and 23B each include a capacitor 4020. The capacitor 4020 includes a region where part of the source electrode or part of the drain electrode of the transistor 4010 overlaps with an electrode 4021 with the insulating layer 4103 interposed therebetween. The electrode 4021 is formed using the same conductive layer as the electrode 4017.

In general, the capacitance of a capacitor provided in a display device is set in consideration of leakage current or the like of transistors provided in a pixel portion so that charge can be held for a predetermined period. The capacitance of the capacitor may be set considering off-state current of the transistor or the like.

For example, when an OS transistor is used in a pixel portion of a liquid crystal display device, the capacitance of the capacitor can be one-third or less, or one-fifth or less, of the capacitance of a liquid crystal. Using an OS transistor can omit the formation of a capacitor.

The transistor 4010 included in the pixel portion 4002 is electrically connected to the display element. An example of a liquid crystal display device using a liquid crystal element as a display element is illustrated in FIG. 23A. In FIG. 23A, a liquid crystal element 4013 that is the display element includes the first electrode layer 4030, a second electrode layer 4031, and a liquid crystal layer 4008. Insulating layers 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031 (a cell gap). A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes the liquid crystal exhibiting a blue phase and the chiral material has a short response time of 1 msec or less and is optically isotropic; therefore, alignment treatment is not necessary and viewing angle dependence is small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be increased.

Moreover, it is possible to use a method called domain multiplication or multi-domain design, in which a pixel is divided into some regions (subpixels) and molecules are aligned in different directions in their respective regions.

The specific resistance of the liquid crystal material is higher than or equal to $1 \times 10^9$ Ω·cm, preferably higher than or equal to $1 \times 10^{11}$ Ω·cm, further preferably higher than or equal to $1 \times 10^{12}$ Ω·cm. Note that the specific resistance in this specification is measured at 20° C.

In the OS transistor used in this embodiment, the current in an off state (the off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption.

In the OS transistor, relatively high field-effect mobility can be obtained, whereby high-speed operation is possible. Consequently, when the above transistor is used in a pixel portion of a display device, high-quality images can be obtained. Since a driver circuit portion and the pixel portion can be formed over one substrate with the use of the above transistor, the number of components of the display device can be reduced.

In the display device, a black matrix (a light-blocking layer), an optical member (an optical substrate) such as a polarizing member, a retardation member, or an anti-reflection member, and the like may be provided as appropriate. For example, circular polarization may be applied with a polarizing substrate and a retardation substrate. In addition, a backlight, a side light, or the like may be used as a light source.

As the display element included in the display device, an EL element can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (i.e., electrons and holes) are recombined; thus, the light-emitting organic compound is excited. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by an evaporation method (including a vacuum evaporation method), a transfer method, a printing method, an inkjet method, a coating method, or the like.

Inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. On the other hand, the thin-film inorganic EL element has a structure where a light-emitting layer is sandwiched between dielectric layers, which is further sandwiched between electrodes, and its light emission mechanism is localized type light emission that utilizes inner-shell electron transition of metal ions. An example in which an organic EL element is used as the light-emitting element is described here.

In order to extract light emitted from the light-emitting element, at least one of the pair of electrodes is transparent. The transistor and the light-emitting element are formed over a substrate. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 23B illustrates an example of a light-emitting display device (also referred to as an "EL display device") using a light-emitting element as a display element. A light-emitting element 4513 that is the display element is electrically connected to the transistor 4010 in the pixel portion 4002. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The bank 4510 can be formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 consists of either a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space that is sealed by the first substrate 4001, the second substrate 4006, and the sealant 4005, a filler 4514 is provided. It is preferable that, in this manner, the display device be packaged (sealed) with a protective film (such as a laminate film or an ultraviolet curable resin film) or a cover member with high air-tightness and little degasification so that the display device is not exposed to the outside air.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if necessary, an optical film, such as a polarizing plate, a circularly polarizing plate (including an elliptically polarizing plate), a retardation plate (a quarter-wave plate or a half-wave plate), or a color filter, may be provided as appropriate on a light-emission side of the light-emitting element. Furthermore, the polarizing plate or the circularly polarizing plate may be provided with an anti-reflection film. For example, anti-glare treatment by which reflected light can be diffused by unevenness of the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (each of which is also called a pixel electrode layer, a common electrode layer, a counter electrode layer, or the like) for applying voltage to the display element each have either a light-transmitting property or a light-reflecting property, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called a conductive polymer) can also be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

Embodiment 7

In this embodiment, a memory device in which the semiconductor device described in Embodiment 1 can be used will be described with reference to FIGS. 24A and 24B.

Figure 24A:
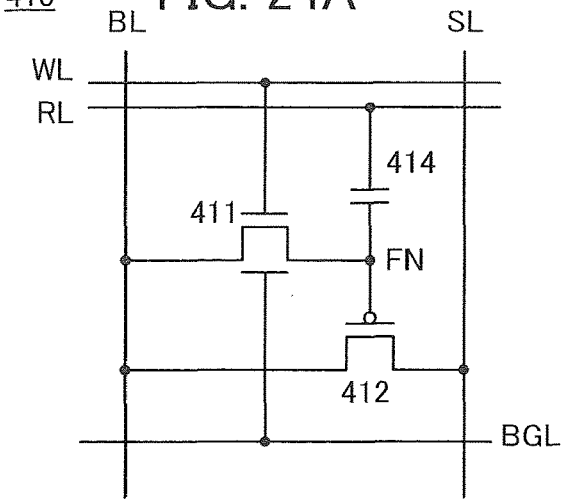
FIGS. 24A and 24B are circuit block diagrams illustrating an example of a memory device.

FIG. 24A illustrates the circuit configuration of a memory cell 410 functioning as a memory element.

The memory cell 410 in FIG. 24A includes a transistor 411 including first and second gates, a transistor 412, a capacitor 414, a node FN, a wiring BL, a wiring SL, a wiring WL, a wiring RL, and a wiring BGL.

In the memory cell 410 in FIG. 24A, the first gate of the transistor 411 is electrically connected to the wiring WL; the second gate of the transistor 411 is electrically connected to the wiring BGL; one of a source and a drain of the transistor 411 is electrically connected to the wiring BL; and the other of the source and the drain of the transistor 411 is electrically connected to the node FN.

In the memory cell 410 in FIG. 24A, a gate of the transistor 412 is electrically connected to the node FN; one of a source and a drain of the transistor 412 is electrically connected to the wiring BL; and the other of the source and the drain of the transistor 412 is electrically connected to the wiring SL.

In the memory cell 410 in FIG. 24A, a first terminal of the capacitor 414 is electrically connected to the wiring RL, and a second terminal of the capacitor 414 is electrically connected to the node FN.

The transistor 411 preferably has low off-state current. For example, the off-state current of the transistor 411 is preferably lower than or equal to $10^{-18}$ A/μm, more preferably lower than or equal to $10^{-21}$ A/μm, still more preferably lower than or equal to $10^{-24}$ A/μm. An OS transistor can be used as a transistor having low off-state current.

The transistor 412 preferably has little variation in threshold voltage. Here, transistors with little variation in threshold voltage refer to transistors fabricated in the same process to have an acceptable threshold voltage difference of 100 mV or less, and are specifically transistors including single crystal silicon in channels.

The memory cell 410 utilizes a characteristic in which the charge of the node FN can be held, so that data can be written, held, and read as follows.

Data writing and data holding will be described. First, a potential is applied to the wiring WL so that the transistor 411 is turned on. Accordingly, the potential of the wiring BL is applied to the node FN. That is, predetermined charge is supplied to the node FN (data writing). Here, charge for applying either of two different potential levels (hereinafter referred to as a low level and a high level) is given. After that, the transistor 411 is turned off, so that the charge given to the node FN is held (data holding).

Since the off-state current of the transistor 411 is extremely low, the charge of the gate of the transistor 411 is held for a long time.

Next, data reading is described. An appropriate potential (reading potential) is applied to the wiring RL while the wiring BL is electrically floating in the state where a predetermined potential (constant potential) is applied to the wiring SL, so that the potential of the wiring BL varies depending on the amount of charge held in the gate of the transistor 412. This is because when the transistor 412 is a p-channel transistor, an apparent threshold voltage $V_{th\_H}$ in the case where a high level is supplied to the node FN is usually lower than an apparent threshold voltage $V_{th\_L}$ in the case where a low level is supplied to the node FN. Here, an apparent threshold voltage refers to the potential of the wiring RL that is needed to turn on the transistor 412. Thus, when the potential of the wiring RL is set to a potential that is between $V_{th\_H}$ and $V_{th\_L}$, charge given to the gate of the transistor 412 can be determined. For example, in the case where the low level is supplied in data writing, the transistor 412 is turned on when the potential of the node FN is $V_0$ ($<V_{th\_L}$). In the case where the high-level charge is supplied in data writing, the transistor 412 remains in an off state even when the potential of the node FN is set to $V_0$ ($>V_{th\_H}$). Therefore, the retained data can be read by determining the potential of the wiring BL.

Note that although the transistor 412 is a p-channel transistor in the above description, one embodiment of the present invention is not limited thereto. The transistor 412 might be an n-channel transistor.

Figure 24B:
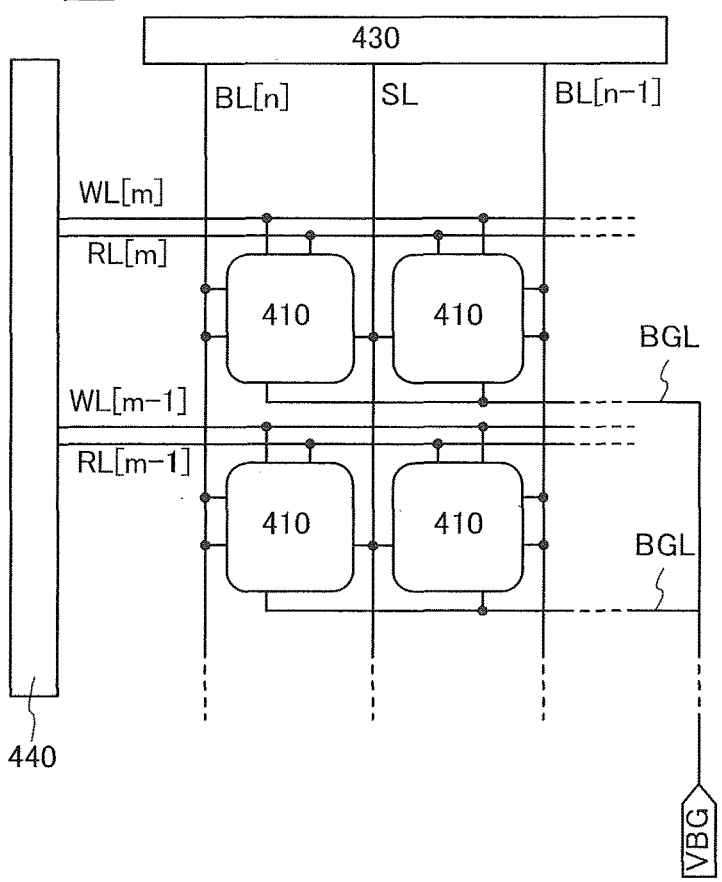

FIG. 24B illustrates the circuit configuration of a memory device 420. The memory device 420 includes the memory cells 410 arranged in a matrix, a column selection driver 430 electrically connected to the memory cells 410 through the wirings BL and SL, and a row selection driver 440 electrically connected to the memory cells 410 through the wirings WL and RL. The memory device 420 functions as a non-volatile memory.

The row selection driver 440 is a circuit configured to selectively turn on the transistors 411 in the memory cells 410 in each row and to selectively change the potentials of the nodes FN in the memory cells 410 in each row. The row selection driver 440 in the memory device 420 allows the memory cells 410 to be selected row by row and data to be written and read to/from the selected memory cells 410.

The column selection driver 430 is a circuit configured to selectively write data to the nodes FN in the memory cells 410 in each column through the wirings BL, to supply potentials to the wirings BL and SL, and to bring the wirings BL into an electrically floating state. The column selection driver 430 in the memory device 420 allows the memory cells 410 to be selected column by column and data to be written and read to/from the selected memory cells 410.

The memory device 420 includes the memory cells 410 arranged in a matrix of m rows and n columns. Here, m and n are each a natural number of 2 or more. The memory cells 410 provided in the m-th row are electrically connected to wirings WL[m] and RL[m], and the memory cells 410 provided in the n-th column are electrically connected to a wiring BL[n] and the wiring SL.

The second gates of the transistors 411 included in the memory cells 410 are supplied with a potential VBG through the wirings BGL. When the second gate of the transistor 411 is supplied with the potential VBG, the transistor 411 can have an appropriate $V_{th}$ and can be prevented from being normally on. Consequently, the off-state current of the transistor 411 can be reduced, and thus the charge written to the node FN can be held.

When the memory device 420 has such a structure, data can be held for a long time even after the memory device 420 is powered off.

For the column selection driver 430 or the row selection driver 440, the semiconductor device described in Embodiment 1 can be used. With the use of the semiconductor device described in Embodiment 1, the number of transistors in the column selection driver 430 or the row selection driver 440 can be smaller and the power consumption of the memory device 420 can be reduced.

Embodiment 8

In this embodiment, the crystal structures of an oxide semiconductor that can be used for the OS transistor described in the above embodiment will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis-aligned a-b-plane-anchored crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

A CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

While in the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in analysis of the CAAC-OS film including an $InGaZnO_4$ crystal by an out-of-plane method, another peak may appear when 2θ is around 36°, in addition to the peak at 2θ of around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film with a low impurity concentration. The impurity is an element other than the main components of the oxide semiconductor film, such as hydrogen, carbon, silicon, or a transition metal element. An element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity. Additionally, the impurity contained in the oxide semiconductor film might serve as a carrier trap or a carrier generation source.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has a negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. An electric charge trapped by the carrier traps in the oxide semiconductor film takes a long time to be released. The trapped electric charge may behave like a fixed electric charge. Thus, the transistor which includes the oxide semiconductor film having a high impurity concentration and a high density of defect states might have unstable electrical characteristics.

In a transistor using the CAAC-OS film, a change in the electric characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS, for example, a grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is analyzed by an out-of-plane method with an XRD apparatus using an X-ray beam having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film will be described.

The amorphous oxide semiconductor film is an oxide semiconductor film having disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In this manner, growth of the crystal part occurs due to the crystallization of the a-like OS film, which is induced by a slight amount of electron beam employed in the TEM observation. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image.

The density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to form an oxide semiconductor film having a density of lower than 78% of the density of the single crystal oxide semiconductor having the same composition.

Specific examples of the above description are given. For example, in the case of an oxide semiconductor film having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor film having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of the single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more of an amorphous oxide semiconductor film, an a-like OS film, a microcrystalline oxide semiconductor film, and a CAAC-OS film, for example.

In this specification and the like, terms for describing arrangement, such as "over" and "under", are used for convenience to indicate a positional relation between components with reference to drawings. The positional relation between components is changed as appropriate in accordance with a direction in which the components are described. Therefore, the terms for explaining arrangement are not limited to those used in this specification and may be changed to other terms as appropriate depending on the situation.

Furthermore, in a block diagram in this specification and the like, components are functionally classified and shown by blocks that are independent of each other. However, in an actual circuit and the like, such components are sometimes hard to classify functionally, and there is a case where one circuit is associated with a plurality of functions or a case where a plurality of circuits are associated with one function. Therefore, the segmentation of blocks in a block diagram is not limited by any of the components described in the specification and can be differently determined as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2015-203976 filed with Japan Patent Office on Oct. 15, 2015, the entire contents of which are hereby incorporated by reference.

What is claimed is:
1. A semiconductor device comprising:
a first transistor;
a second transistor;
a third transistor;
a first wiring; and
a second wiring,
wherein the first transistor comprises a first gate and a second gate,
wherein the first gate and the second gate overlap with each other with a semiconductor therebetween,
wherein the first wiring is configured to transmit a high power supply potential,
wherein the second wiring is configured to transmit a low power supply potential,
wherein a first terminal of the first transistor is electrically connected to the first gate,
wherein the first terminal of the first transistor is electrically connected to the first wiring,
wherein a second terminal of the first transistor is electrically connected to the second gate,
wherein the second terminal of the first transistor is electrically connected to the second wiring through the second transistor and the third transistor, and
wherein the first transistor, the second transistor, and the third transistor are n-channel transistors.
2. The semiconductor device according to claim 1, wherein the semiconductor includes an oxide semiconductor.
3. An electronic device comprising:
the semiconductor device according to claim 1; and
at least one of a microphone, a speaker, a display portion, and an operation button.
4. A semiconductor device comprising:
a first transistor;
a second transistor;
a first wiring; and
a second wiring,
wherein the first transistor comprises a first gate and a second gate,
wherein the first gate and the second gate overlap with each other with a first semiconductor therebetween,
wherein the second transistor comprises a third gate and a fourth gate, wherein the third gate and the fourth gate overlap with each other with a second semiconductor therebetween,
wherein the first wiring is configured to transmit a first power supply potential,
wherein the second wiring is configured to transmit a second power supply potential,
wherein a first terminal of the first transistor is electrically connected to the first gate,
wherein the first terminal of the first transistor is electrically connected to the first wiring,
wherein a second terminal of the first transistor is electrically connected to the second gate,
wherein the second terminal of the first transistor is electrically connected to the second wiring through the second transistor,
wherein the first transistor and the second transistor have the same polarity,
wherein the first power supply potential and the second power supply potential are different from each other,
wherein the third gate is configured to receive a first data, and
wherein the second terminal of the first transistor is configured to output a second data.

5. The semiconductor device according to claim 4,
wherein the first power supply potential is a high power supply potential,
wherein the second power supply potential is a low power supply potential, and
wherein the first transistor and the second transistor are n-channel transistors.

6. The semiconductor device according to claim 5,
wherein the first data is data A,
wherein the fourth gate is configured to receive data B,
wherein the second data is data Z,
wherein the data A, the data B, and the data Z are each of a Boolean data type, and
wherein the data Z is denoted by NOT(A+B).

7. The semiconductor device according to claim 5,
wherein the first semiconductor and the second semiconductor each include an oxide semiconductor.

8. A semiconductor device comprising:
a first transistor;
a second transistor;
a third transistor;
a first wiring; and
a second wiring,
wherein the first transistor comprises a first gate and a second gate,
wherein the first gate and the second gate overlap with each other with a first semiconductor therebetween,
wherein the second transistor comprises a third gate and a fourth gate,
wherein the third gate and the fourth gate overlap with each other with a second semiconductor therebetween,
wherein the third transistor comprises a fifth gate and a sixth gate,
wherein the fifth gate and the sixth gate overlap with each other with a third semiconductor therebetween,
wherein the first wiring is configured to transmit a high power supply potential,
wherein the second wiring is configured to transmit a low power supply potential,
wherein a first terminal of the first transistor is electrically connected to the first gate,
wherein the first terminal of the first transistor is electrically connected to the first wiring,
wherein a second terminal of the first transistor is electrically connected to the second gate,
wherein the second terminal of the first transistor is electrically connected to the second wiring through the second transistor and the third transistor, and
wherein the first transistor, the second transistor, and the third transistor are n-channel transistors.

9. The semiconductor device according to claim 8,
wherein the third gate is configured to receive data A,
wherein the fourth gate is configured to receive data C,
wherein the fifth gate is configured to receive data B,
wherein the sixth gate is configured to receive the data C,
wherein the second terminal of the first transistor is configured to output data Z,
wherein the data A, the data B, the data C, and the data Z are each of a Boolean data type, and
wherein the data Z is denoted by NOT((A×B)+C).

10. The semiconductor device according to claim 8,
wherein the first semiconductor, the second semiconductor, and the third semiconductor each include an oxide semiconductor.

11. A semiconductor device comprising:
a first transistor;
a second transistor;
a third transistor;
a first wiring; and
a second wiring,
wherein the first transistor comprises a first gate and a second gate,
wherein the first gate and the second gate overlap with each other with a first semiconductor therebetween,
wherein the second transistor comprises a third gate and a fourth gate,
wherein the third gate and the fourth gate overlap with each other with a second semiconductor therebetween,
wherein the first wiring is configured to transmit a high power supply potential,
wherein the second wiring is configured to transmit a low power supply potential,
wherein a first terminal of the first transistor is electrically connected to the first gate,
wherein the first terminal of the first transistor is electrically connected to the first wiring,
wherein a second terminal of the first transistor is electrically connected to the second gate,
wherein the second terminal of the first transistor is electrically connected to the second wiring through the second transistor and the third transistor, and
wherein the first transistor, the second transistor, and the third transistor are n-channel transistors.

12. The semiconductor device according to claim 11,
wherein the first semiconductor and the second semiconductor each include an oxide semiconductor.

13. A semiconductor device comprising:
a first transistor;
a second transistor;
a third transistor;
a first wiring; and
a second wiring,
wherein the first transistor comprises a first gate and a second gate,
wherein the first gate and the second gate overlap with each other with a semiconductor therebetween,
wherein the first wiring is configured to transmit a first power supply potential,
wherein the second wiring is configured to transmit a second power supply potential, wherein a first terminal of the first transistor is electrically connected to the first gate, wherein the first terminal of the first transistor is electrically connected to the second wiring, wherein a second terminal of the first transistor is electrically connected to the second gate, wherein the second terminal of the first transistor is electrically connected to the first wiring through the second transistor and the third transistor, wherein the first transistor, the second transistor, and the third transistor have the same polarity, and wherein the first power supply potential and the second power supply potential are different from each other.

14. The semiconductor device according to claim 13, wherein the second transistor comprises a third gate and a fourth gate, and wherein the third gate and the fourth gate overlap with each other with a second semiconductor therebetween.

15. The semiconductor device according to claim 13, wherein the second transistor comprises a third gate and a fourth gate, wherein the third gate and the fourth gate overlap with each other with a second semiconductor therebetween, wherein the third transistor comprises a fifth gate and a sixth gate, and wherein the fifth gate and the sixth gate overlap with each other with a third semiconductor therebetween.

* * * * *